US012588496B2

(12) United States Patent
Park et al.

(10) Patent No.: US 12,588,496 B2
(45) Date of Patent: Mar. 24, 2026

(54) SEMICONDUCTOR DEVICE AND DATA STORAGE SYSTEM INCLUDING THE SAME

(71) Applicant: SAMSUNG ELECTRONICS CO., LTD., Suwon-si (KR)

(72) Inventors: Yejin Park, Suwon-si (KR); Seungyoon Kim, Suwon-si (KR); Jongseon Ahn, Suwon-si (KR); Heesuk Kim, Suwon-si (KR); Jaehwang Sim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 384 days.

(21) Appl. No.: 18/142,872

(22) Filed: May 3, 2023

(65) Prior Publication Data

US 2024/0038659 A1 Feb. 1, 2024

(30) Foreign Application Priority Data

Jul. 27, 2022 (KR) ........................ 10-2022-0093317

(51) Int. Cl.
H01L 23/528 (2006.01)
H01L 23/522 (2006.01)
(Continued)

(52) U.S. Cl.
CPC ...... H01L 23/5283 (2013.01); H01L 23/5226 (2013.01); H01L 25/0652 (2013.01);
(Continued)

(58) Field of Classification Search
CPC ....... H01L 23/5226; H01L 2225/06541; H01L 23/5283; H10B 41/27; H10B 41/35;
(Continued)

(56) References Cited

U.S. PATENT DOCUMENTS

| | | | |
|---|---|---|---|
| 7,402,512 | B2 | 7/2008 | Derraa et al. |
| 9,960,118 | B2 | 5/2018 | Kang et al. |

(Continued)

FOREIGN PATENT DOCUMENTS

| | | |
|---|---|---|
| JP | 2005-317788 A | 11/2005 |
| KR | 10-2015-0095148 A | 8/2015 |

OTHER PUBLICATIONS

Communication issued on Jan. 4, 2024 by the European Patent Office in European Patent Application No. 23185431.6.

*Primary Examiner* — Sonya McCall-Shepard
(74) *Attorney, Agent, or Firm* — Sughrue Mion, PLLC

(57) ABSTRACT

A semiconductor device includes a substrate; a conductive layer; and a contact plug connected to the conductive layer. The contact plug includes a first portion; and a second portion, sequentially stacked, wherein a width of an upper surface of the first portion is wider than a width of a lower surface of the second portion. The contact plug includes a barrier layer; a first conductive layer on the barrier layer; and a second conductive layer on the first conductive layer. The second conductive layer comprises voids. The barrier layer, the first conductive layer, and the second conductive layer extend continuously in the first and second portions. The barrier layer has a first thickness, the second conductive layer has a second thickness, equal to or greater than the first thickness, and the first conductive layer has a third thickness, equal to or greater than the second thickness.

20 Claims, 33 Drawing Sheets

(51) Int. Cl.

| | |
|---|---|
| *H01L 25/065* | (2023.01) |
| *H10B 41/10* | (2023.01) |
| *H10B 41/27* | (2023.01) |
| *H10B 41/35* | (2023.01) |
| *H10B 41/50* | (2023.01) |
| *H10B 43/10* | (2023.01) |
| *H10B 43/27* | (2023.01) |
| *H10B 43/35* | (2023.01) |
| *H10B 43/50* | (2023.01) |
| *H10B 80/00* | (2023.01) |

(52) U.S. Cl.
CPC ............. *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H10B 80/00* (2023.02); *H01L 2225/06541* (2013.01)

(58) Field of Classification Search
CPC ........ H10B 43/27; H10B 43/35; H10B 41/50; H10B 43/50; H10B 41/10; H10B 43/10
See application file for complete search history.

(56) References Cited

U.S. PATENT DOCUMENTS

| | | | | |
|---|---|---|---|---|
| 10,115,632 | B1 * | 10/2018 | Masamori | H10B 43/27 |
| 10,276,636 | B2 | 4/2019 | Kim | |
| 10,475,806 | B2 * | 11/2019 | Yagi | H10B 43/50 |
| 10,971,507 | B2 | 4/2021 | Kaminaga | |
| 10,971,521 | B2 * | 4/2021 | Yang | H10B 43/27 |
| 11,069,631 | B2 | 7/2021 | Onuma | |
| 11,127,899 | B2 | 9/2021 | Greenlee et al. | |
| 2012/0061744 | A1 * | 3/2012 | Hwang | H10B 43/30 257/E27.081 |
| 2015/0228345 | A1 | 8/2015 | Kwon et al. | |
| 2015/0325588 | A1 * | 11/2015 | Lee | H10B 43/30 257/329 |
| 2017/0162592 | A1 * | 6/2017 | Nishikawa | H10B 43/40 |
| 2018/0240700 | A1 | 8/2018 | Omori et al. | |
| 2019/0287916 | A1 | 9/2019 | Sharangpani et al. | |
| 2021/0074719 | A1 * | 3/2021 | Lee | H10B 41/10 |
| 2021/0193672 | A1 | 6/2021 | Kim et al. | |
| 2022/0189958 | A1 * | 6/2022 | Choi | H10B 43/40 |
| 2022/0231038 | A1 * | 7/2022 | Baek | H10B 41/27 |
| 2023/0207011 | A1 * | 6/2023 | Scarbrough | G11C 16/0483 257/314 |

* cited by examiner

SEMICONDUCTOR DEVICE AND DATA STORAGE SYSTEM INCLUDING THE SAME

CROSS-REFERENCE TO RELATED APPLICATION

This application claims priority to Korean Patent Application No. 10-2022-0093317 filed on Jul. 27, 2022 in the Korean Intellectual Property Office, the disclosure of which is incorporated by reference herein in its entirety.

BACKGROUND

The present disclosure relates to a semiconductor device and a data storage system including the same.

In a data storage system necessary for data storage, a semiconductor device capable of storing high-capacity data is required. Accordingly, a method for increasing data storage capacity of a semiconductor device has been researched. For example, as a method for increasing data storage capacity of a semiconductor device, a semiconductor device including memory cells arranged three-dimensionally, instead of memory cells arranged two-dimensionally, has been proposed.

SUMMARY

One or more example embodiments provide a semiconductor device having improved reliability and mass productivity.

Further, one or more example embodiments provide a data storage system including a semiconductor device having improved reliability and mass productivity.

According to an aspect of an example embodiment, a semiconductor device includes: a first semiconductor structure including a substrate, circuit devices on the substrate, and lower interconnection lines on the circuit devices; and a second semiconductor structure on the first semiconductor structure, and having a first region and a second region, the second semiconductor structure including a source structure, gate electrodes spaced apart from each other and stacked on the source structure in a first direction perpendicular to an upper surface of the source structure, channel structures penetrating through the gate electrodes in the first region, extending in the first direction, each of the channel structures including a channel layer, contact plugs penetrating through the gate electrodes and the source structure in the second region, extending in the first direction, and electrically connecting the gate electrodes to a portion of the lower interconnection lines, and support structures penetrating through the gate electrodes in the second region and extending in the first direction, wherein each of the channel structures, each of the contact plugs, and each of the support structures includes a first portion, a second portion, and a third portion, sequentially stacked from lower portions thereof, respectively, wherein a width of an upper surface of the first portion is wider than a width of a lower surface of the second portion, respectively, and a width of an upper surface of the second portion is wider than a width of a lower surface of the third portion, respectively, and wherein each of the contact plugs includes a barrier layer, a first conductive layer on the barrier layer, and a second conductive layer on the first conductive layer, the second conductive layer having voids.

According to an aspect of an example embodiment, a semiconductor device includes: a semiconductor structure including: a substrate, and a conductive layer in or on the substrate; and a contact plug connected to the conductive layer and extending in a first direction that is perpendicular to an upper surface of the substrate, the contact plug including a first portion and a second portion that are sequentially stacked from a lower portion of the contact plug, wherein a width of an upper surface of the first portion is wider than a width of a lower surface of the second portion, and wherein the contact plug includes: a barrier layer, a first conductive layer on the barrier layer, and a second conductive layer on the first conductive layer and including voids, wherein the barrier layer, the first conductive layer, and the second conductive layer, extend continuously in the first portion and the second portion, and wherein the barrier layer has a first thickness, wherein the second conductive layer has a second thickness that is equal to or greater than the first thickness, and wherein the first conductive layer has a third thickness that is equal to or greater than the second thickness.

According to an aspect of an example embodiment, a data storage system includes: a semiconductor storage device including a substrate, circuit devices on the substrate, lower interconnection lines on the circuit devices, a plate layer on the lower interconnection lines, gate electrodes spaced apart from each other and stacked on the plate layer in a first direction, perpendicular to an upper surface of the plate layer, a contact plug penetrating through the gate electrodes, extending in the first direction, and electrically connecting a first gate electrode, among the gate electrodes, to a first lower interconnection line, among the lower interconnection lines, and an input/output pad electrically connected to the circuit devices; and a controller electrically connected to the semiconductor storage device through the input/output pad and configured to control the semiconductor storage device, wherein the contact plug includes: a barrier layer, a first conductive layer on the barrier layer, and a second conductive layer on the first conductive layer, and wherein the contact plug has a vertical extension portion extending in the first direction and a horizontal extension portion extending horizontally from the vertical extension portion toward the first gate electrode.

BRIEF DESCRIPTION OF THE DRAWINGS

The above and other aspects, features, and advantages of the present disclosure will be more clearly understood from the following detailed description of example embodiments, taken in conjunction with the accompanying drawings, in which.

DETAILED DESCRIPTION

Hereinafter, example embodiments will be described with reference to the accompanying drawings.

Figure 1:
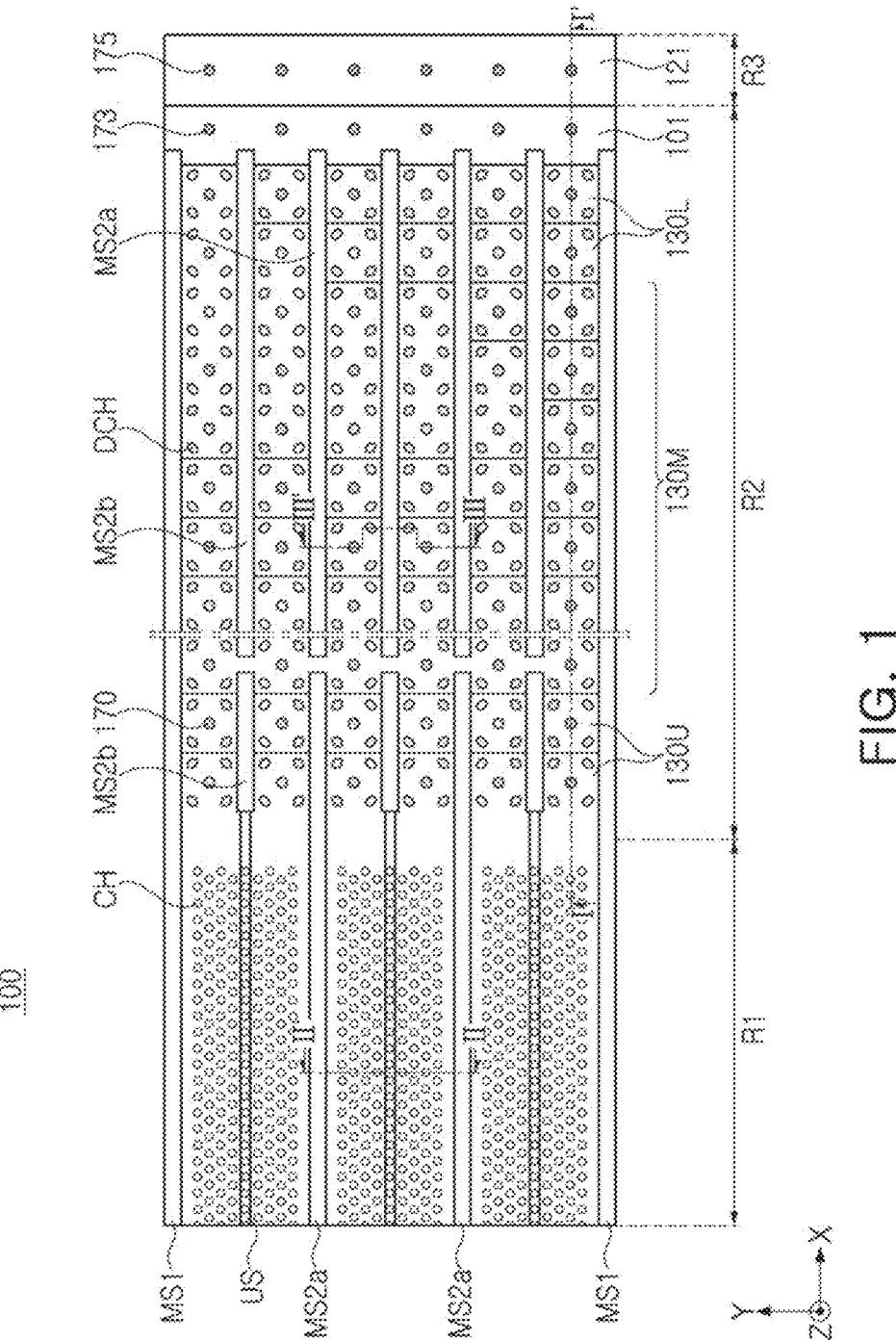
FIG. 1 is a schematic plan view of a semiconductor device according to example embodiments.
Figure 2A:
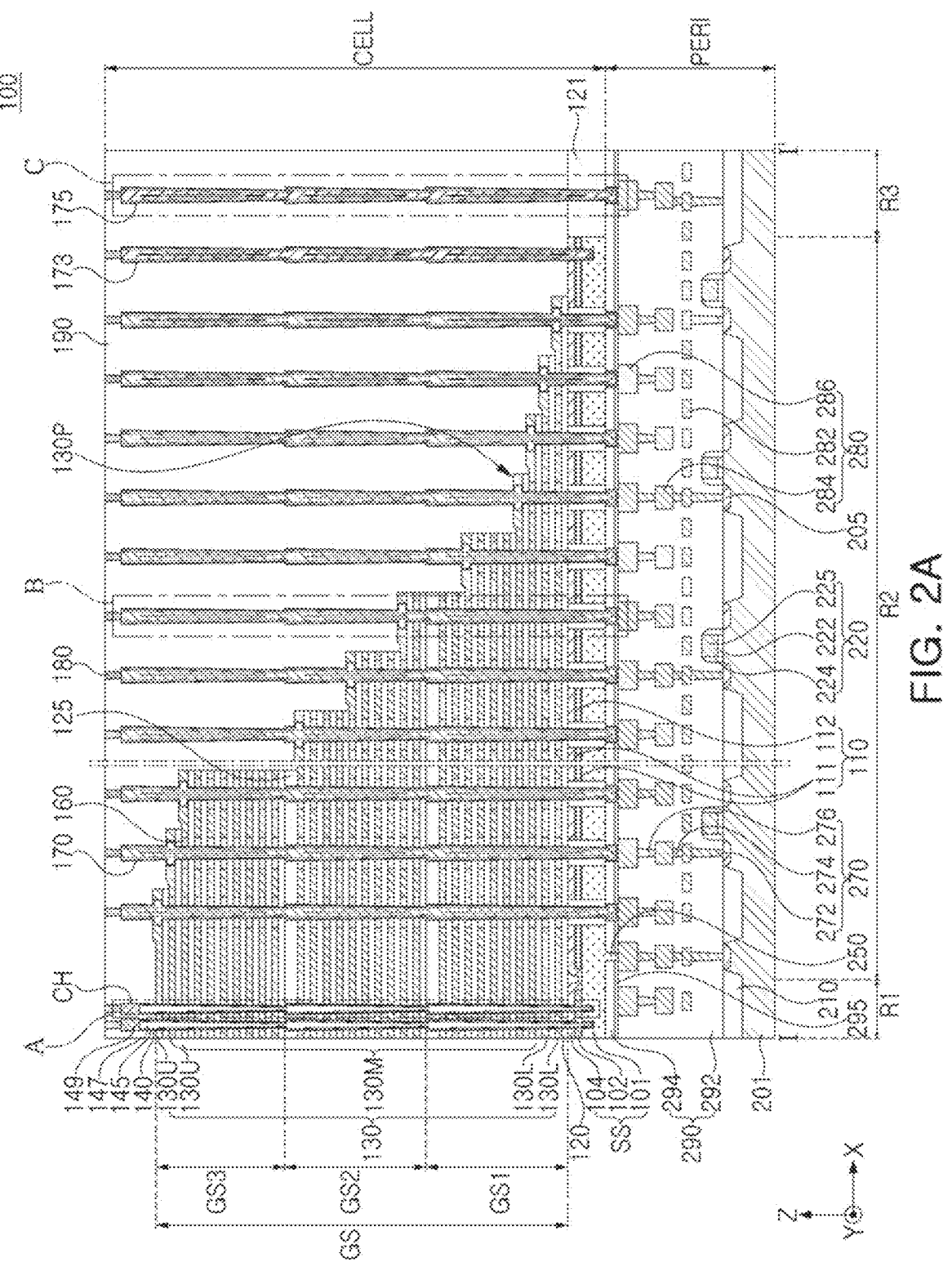
FIGS. 2A, 2B and 2C are schematic cross-sectional views of a semiconductor device according to example embodiments.
Figure 2B:
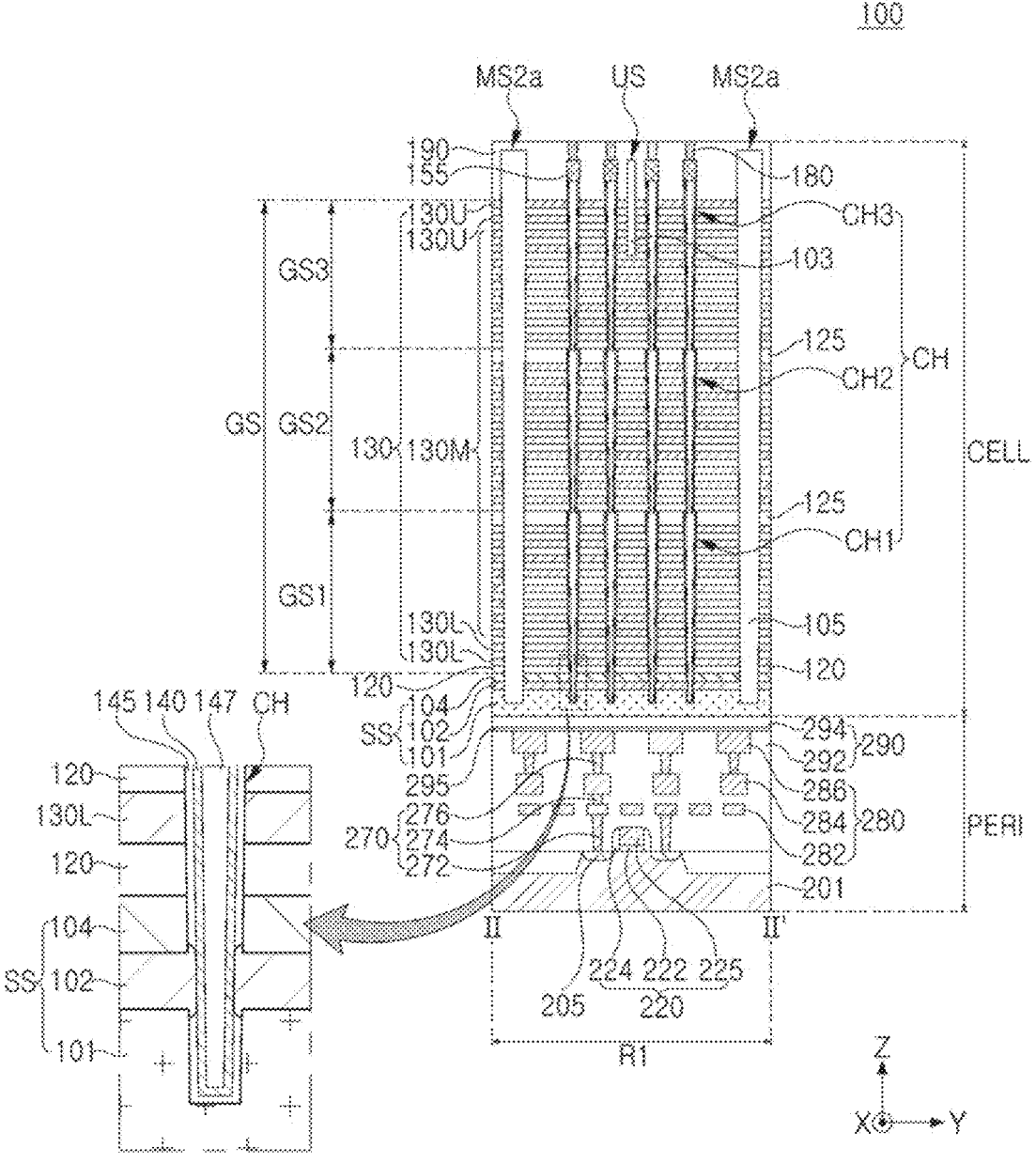
Figure 2C:
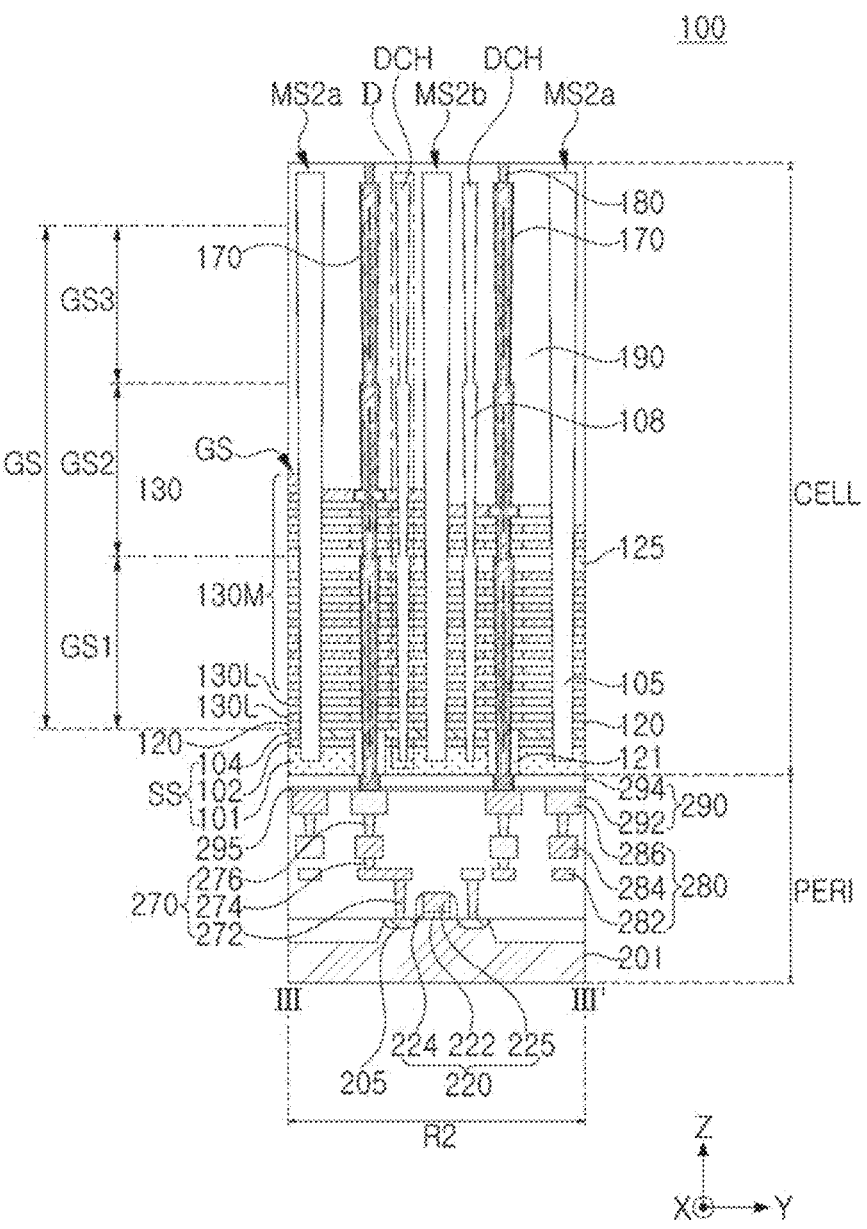

FIG. 1 is a schematic plan view of a semiconductor device according to example embodiments;

FIGS. 2A, 2B and 2C are schematic cross-sectional views of a semiconductor device according to example embodiments. FIGS. 2A, 2B and 2C illustrate cross-sections of FIG. 1, taken along lines I-I', and, respectively.

Figure 3:
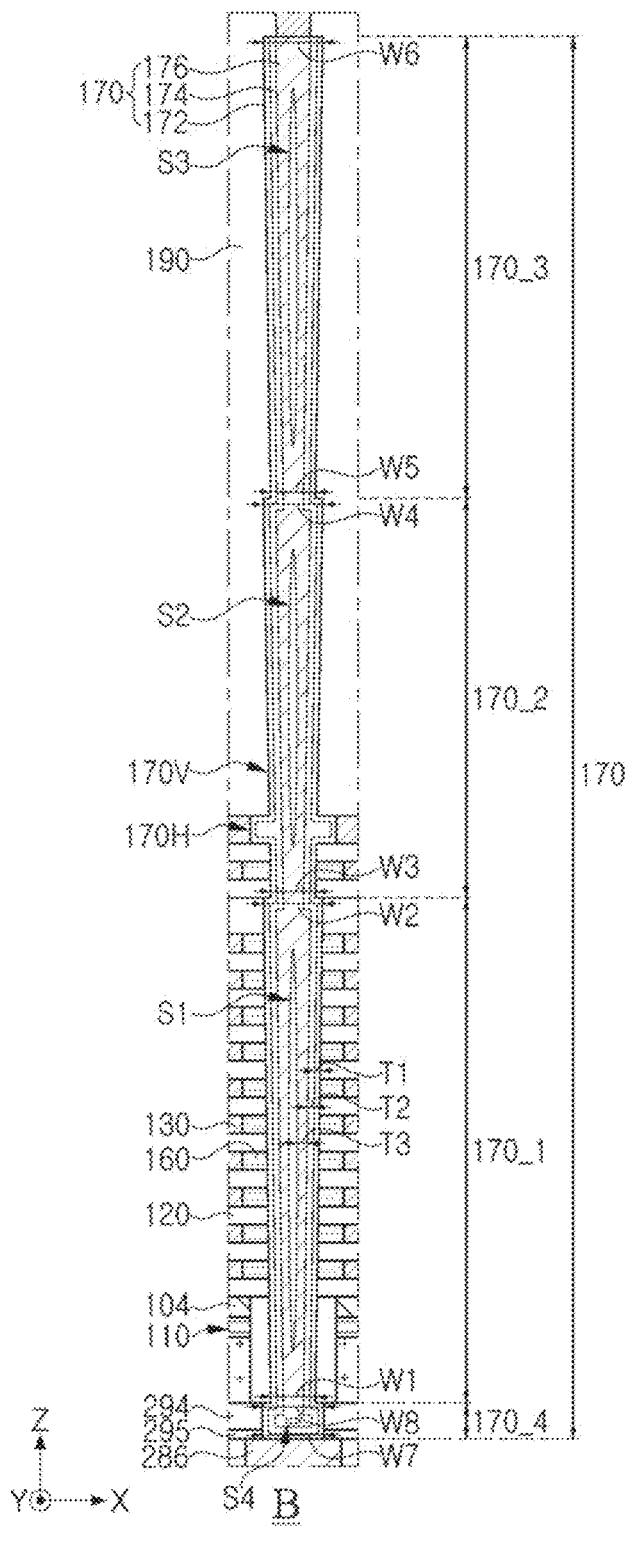
FIG. 3 is a partially enlarged view illustrating a region of a semiconductor device according to example embodiments.

FIG. 3 is a partially enlarged view illustrating a region of a semiconductor device according to example embodiments. FIG. 3 is an enlarged view of portion 'B' of FIG. 2A.

Figure 4:
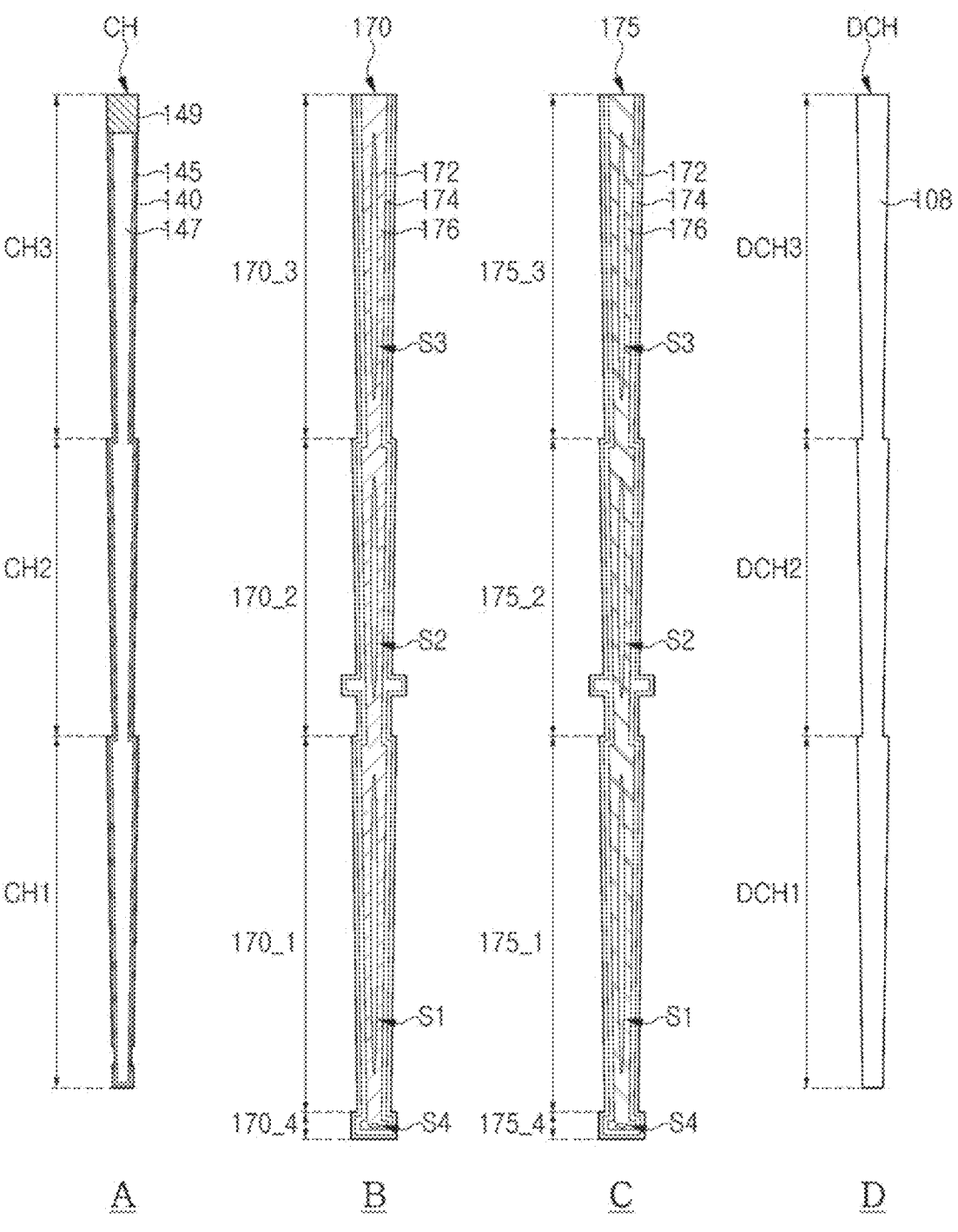
FIG. 4 is a partially enlarged view illustrating some configurations of a semiconductor device according to example embodiments.

FIG. 4 is a partially enlarged view illustrating some configurations of a semiconductor device according to example embodiments. FIG. 4 illustrates enlarged views of a channel structure CH in portion 'A' of FIG. 2A, a contact plug 170 in portion 'B' of FIG. 2A, a through-via 175 in portion 'C' of FIG. 2A, and a support structure DCH in portion 'D' of FIG. 2C.

First, referring to the example embodiments shown in FIGS. 1, 2A, 2B and 2C, a semiconductor device 100 may include a peripheral circuit region PERI, which may be a first semiconductor structure including a substrate 201, and a memory cell region CELL, which may be a second semiconductor structure including a plate layer 101. The memory cell region CELL may be disposed on the peripheral circuit region PERI. Conversely, in example embodiments, the memory cell region CELL may be disposed below the peripheral circuit region PERI.

The peripheral circuit region PERI may include a substrate 201, impurity regions 205 and device isolation layers 210 in the substrate 201, and circuit devices 220, a peripheral region insulating layer 290, a lower protective layer 295, lower contact plugs 270, lower interconnection lines 280, and a ground via 250, arranged on the substrate 201.

The substrate 201 may have an upper surface extending in an X-direction and a Y-direction. An active region may be defined in the substrate 201 by the device isolation layers 210. The impurity regions 205 including impurities may be disposed in a portion of the active region. The substrate 201 may include a semiconductor material, for example, a group IV semiconductor, a group III-V compound semiconductor, or a group II-VI compound semiconductor, or the like. The substrate 201 may be provided as a bulk wafer or as an epitaxial layer.

The circuit devices 220 may include planar transistors, or the like. Each of the circuit devices 220 may include a circuit gate dielectric layer 222, a spacer layer 224, and a circuit gate electrode 225. The impurity regions 205 may be disposed as source/drain regions in the substrate 201 on both sides of the circuit gate electrode 225.

The peripheral region insulating layer 290 may be disposed on the circuit device 220 on the substrate 201. The peripheral region insulating layer 290 may include first and second peripheral region insulating layers 292 and 294, and the first and second peripheral region insulating layers 292 and 294 may also include a plurality of insulating layers, respectively. The peripheral region insulating layer 290 may be formed of an insulating material.

The lower protective layer 295 may be disposed on upper surfaces of the third lower interconnection lines 286, which may be an uppermost portion, between the first and second peripheral region insulating layers 292 and 294. In example embodiments, the lower protective layer 295 may be further disposed on upper surfaces of the first and second lower interconnection lines 282 and 284. The lower protective layer 295 may be a layer for preventing contamination of the lower interconnection lines 280 by a metal material disposed therebelow. The lower protective layer 295 may be formed of an insulating material, different from that of the peripheral region insulating layer 290, and may include, for example, silicon nitride, or the like.

The lower contact plugs 270 and the lower interconnection lines 280 may form a lower interconnection structure electrically connected to the circuit devices 220 and the impurity regions 205. The lower contact plugs 270 may have a cylindrical shape, and the lower interconnection lines 280 may have a linear shape. The lower contact plugs 270 may include first, second and third lower contact plugs 272, 274, and 276. The first lower contact plugs 272 may be disposed on the circuit devices 220 and the impurity regions 205, and the second lower contact plugs 274 may be disposed on first lower interconnection lines 282 and the third lower contact plugs 276 may be disposed on second lower interconnection lines 284. The lower interconnection lines 280 may include first, second and third lower interconnection lines 282, 284, and 286. The first lower interconnection lines 282 may be disposed on the first lower contact plugs 272, the second lower interconnection lines 284 may be disposed on the second lower contact plugs 274, and the third lower interconnection lines 286 may be disposed on the third lower contact plugs 276. The lower contact plugs 270 and the lower interconnection lines 280 may include a conductive material, respectively, may further include, for example, tungsten (W), copper (Cu), aluminum (Al), or the like, respectively, and may further include a diffusion barrier, respectively. In example embodiments, the number of layers constituting an arrangement of the lower contact plugs 270 and the lower interconnection lines 280 may be variously changed.

The ground via 250 may be disposed in the peripheral circuit region PERI to electrically connect the substrate 201 and the plate layer 101. The ground via 250 may extend from a lower surface of the plate layer 101 to be integrated with the plate layer 101. The ground via 250 may be connected to the substrate 201 through a ground interconnection structure including conductive plugs and conductive lines, corresponding to the lower interconnection structure. The ground via 250 may form a ground structure, together with the ground interconnection structure. The ground structure may perform a function of grounding the plate layer 101 and a second horizontal conductive layer 104, during a process of manufacturing the semiconductor device 100, to prevent occurrence of arcing.

Although only one ground via 250 is illustrated according to the example embodiment in FIG. 2A, a plurality of ground vias 250 may be disposed in the semiconductor device 100 at regular intervals in the Y-direction, for example. The ground via 250 may be disposed below the plate layer 101 in the second region R2, but example embodiments are not limited thereto. The impurity region 205 electrically connected to the ground via 250 may be disposed to be spaced apart from an adjacent region of an active region in which the circuit devices 220 of the peripheral circuit region PERI are disposed. The ground via 250 may include the same semiconductor material as the plate layer 101, for example, at least one of silicon (Si) or germanium (Ge), and may further include impurities. According to example embodiments, the ground via 250 may not be formed integrally with the plate layer 101, but may include a material, different from that of the plate layer 101.

The memory cell region CELL may include first, second and third regions R1, R2, and R3, and may include a source structure SS, gate electrodes 130 stacked on the source structure SS, interlayer insulating layers 120 alternately stacked with the gate electrodes 130, channel structures CH penetrating a gate structure GS in the first region R1, the first separation regions MS1, and the second separation regions MS2a and MS2b extending to penetrate the gate structure GS, contact plugs 170 connected to pad regions 130P of the gate electrodes 130 and extending vertically in the second region R2, and supporter structures DCH penetrating the gate structure GS in the second region R2.

The memory cell region CELL may further include substrate insulating layers 121 penetrating the source structure SS, first and second horizontal conductive layers 102 and 104 disposed below the gate electrodes 130 in the first region R1, a horizontal insulating layer 110 disposed below the gate electrodes 130, together with the second horizontal conductive layer 104, in the second region R2, upper separation regions US partially penetrating through the gate electrodes 130, substrate contacts 173 connected to the source structure SS, through-vias 175 extending from the memory cell region CELL to the peripheral circuit region PERI, upper contact plugs 180 on the channel structures CH and the contact plugs 170, and a cell region insulating layer 190 covering the gate structure GS.

In the memory cell region CELL, the first region R1 may be a region in which the gate electrodes 130 are vertically stacked and the channel structures CH are disposed, and may be a region in which memory cells are disposed. The second region R2 may be a region in which the gate electrodes 130 extend to have different lengths, and may correspond to a region for electrically connecting the memory cells, together with the third region R3, to the peripheral circuit region PERI. The second region R2 may be disposed on at least one end of the first region R1 in at least one direction, for example, the X-direction. The third region R3 may be located outside the second region R2, and may be a region in which the source structure SS is not disposed.

The source structure SS may include a plate layer 101, a first horizontal conductive layer 102, and a second horizontal conductive layer 104, sequentially stacked in the first region R1. The source structure SS may include the plate layer 101 and the second horizontal conductive layer 104 in the second region R2. In example embodiments, the number of conductive layers constituting the source structure SS may be variously changed.

The plate layer 101 may have a plate shape, and may function as at least a portion of a common source line of the semiconductor device 100. The plate layer 101 may have an upper surface extending in the X-direction and the Y-direction. The plate layer 101 may include a conductive material, or the like. For example, the plate layer 101 may include a semiconductor material, such as a group IV semiconductor, a group III-V compound semiconductor, or a group II-VI compound semiconductor, or the like. For example, the group IV semiconductor may include silicon, germanium, or silicon-germanium, or the like. The plate layer 101 may further include impurities. The plate layer 101 may be provided as a polycrystalline semiconductor layer such as a polycrystalline silicon layer, or an epitaxial layer.

The first and second horizontal conductive layers 102 and 104 may be sequentially stacked on the upper surface of the plate layer 101 in the first region R1. According to an example embodiment, the first horizontal conductive layer 102 may not extend to the second region R2, and the second horizontal conductive layer 104 may extend to the second region R2. The first horizontal conductive layer 102 may function as a portion of the common source line of the semiconductor device 100, and may function, for example, as a common source line together with the plate layer 101. As illustrated in the enlarged view of FIG. 2B, according to an example embodiment the first horizontal conductive layer 102 may be directly connected to the channel layer 140 around the channel layer 140. The second horizontal conductive layer 104 may be in contact with the plate layer 101 in a region of the second region R2 in which the first horizontal conductive layer 102 and the horizontal insulating layer 110 are not disposed.

The first and second horizontal conductive layers 102 and 104 may include a semiconductor material, such as polycrystalline silicon, or the like. In this case, at least the first horizontal conductive layer 102 may be a layer doped with impurities of the same conductivity type as the plate layer 101, and the second horizontal conductive layer 104 may be a doped layer or may be a layer including impurities diffused from the first horizontal conductive layer 102. A material of the second horizontal conductive layer 104 is not limited to the semiconductor material, and may be replaced with an insulating layer.

The horizontal insulating layer 110 may be disposed on the plate layer 101 on the same height level as the first horizontal conductive layer 102 in at least a portion of the second region R2. The horizontal insulating layer 110 may include first and second horizontal insulating layers 111 and 112 alternately stacked on the second region R2 of the plate layer 101. The horizontal insulating layer 110 may be layers remaining after a portion of the first horizontal conductive layer 102 may be replaced with the first horizontal conductive layer 102 in the manufacturing process of the semiconductor device 100.

The horizontal insulating layer 110 may include silicon oxide, silicon nitride, silicon carbide, or silicon oxynitride, or the like. The first horizontal insulating layers 111 and the second horizontal insulating layer 112 may include different insulating materials. For example, the first horizontal insulating layers 111 may be formed of the same material as the interlayer insulating layers 120, and the second horizontal insulating layer 112 may be formed of a material, different from that of the interlayer insulating layers 120.

The substrate insulating layers 121 may be disposed to penetrate the plate layer 101, the horizontal insulating layer 110, and the second horizontal conductive layer 104 in the second and third regions R2 and R3. The substrate insulating layers 121 may be disposed to surround the contact plugs 170 in the second region R2, respectively, and may be disposed to surround the through-vias 175 in the third region R3, respectively. According to example embodiments, the substrate insulating layers 121 may be further disposed in the first region R1, and may be disposed, for example, in a region in which the through-vias 175 are additionally disposed. An upper surface of the substrate insulating layer 121 may be substantially coplanar with an upper surface of the source structure SS. The substrate insulating layer 121 may include an insulating material, for example, silicon oxide, silicon nitride, silicon carbide, or silicon oxynitride, or the like.

The gate electrodes 130 may be vertically spaced apart and stacked on the plate layer 101 to form a gate structure GS, together with the interlayer insulating layers 120. The gate structure GS may include first, second and third stack structures GS1, GS2, and GS3, vertically stacked. According to example embodiments, the number of stack structures forming the gate structure GS may be variously changed. For example, according to example embodiments, the gate structure GS may be formed of four or more stack structures or a single stack structure. Upper interlayer insulating layers 125 having a relatively large thickness may be disposed between the first, second and third stack structures GS1, GS2, and GS3. The number of gate electrodes 130 constituting each of the first, second and third stack structures GS1, GS2, and GS3 may be the same or different from each other.

The gate electrodes 130 may include lower gate electrodes 130L forming a gate of a ground select transistor, memory gate electrodes 130M forming a plurality of memory cells, and upper gate electrodes 130U forming gates of string select transistors. The number of memory gate electrodes 130M forming memory cells may be determined according to the capacity of the semiconductor device 100. According to an example embodiment, the number of the upper and lower gate electrodes 130U and 130L may be 1 to 4 or more, respectively, and the upper and lower gate electrodes 130U and 130L may have the same or different structure as the memory gate electrodes 130M. In example embodiments, the gate electrodes 130 may further include a gate electrode 130 disposed on the upper gate electrodes 130U and/or below the lower gate electrodes 130L, and constituting an erase transistor used for an erase operation using a gate induced leakage (GIDL) phenomenon. Also, some of the gate electrodes 130, for example, memory gate electrodes 130M adjacent to the upper or lower gate electrodes 130U and 130L may be dummy gate electrodes.

As illustrated in FIG. 1, the gate electrodes 130 may be disposed to be separated from each other in the Y-direction, by the first separation regions MS1 continuously extending in the first region R1 and the second region R2. Gate electrodes 130 between a pair of first separation regions MS1 may form one memory block, but a range of the memory block is not limited thereto. Some of the gate electrodes 130, for example, the memory gate electrodes 130M, may form one layer in the one memory block, respectively.

The gate electrodes 130 may be vertically spaced apart from each other and stacked in the first region R1 and the second region R2, and may extend from the first region R1 to the second region R2 to have different lengths, to form a stepped structure having a stepped shape in a portion of the second region R2. The gate electrodes 130 may be disposed to have a stepped structure from each other even in the Y-direction. Due to the stepped structure, in the gate electrodes 130, a gate electrode 130, which may be present in a lower portion may extend to be longer than a gate electrode 130, which may be present in an upper portion, and the gate electrodes 130 may have regions of which upper surfaces are exposed upwardly from the interlayer insulating layers 120 and other gate electrodes 130, wherein the regions may be referred to as pad regions 130P. In a gate electrode 130, a pad region 130P may be a region including an end portion of the gate electrode 130 in the X-direction. The gate electrodes 130 may be respectively connected to the contact plugs 170 in the pad regions 130P. The gate electrodes 130 may have an increased thickness in the pad regions 130P.

The gate electrodes 130 may include a metal material, for example, tungsten (W), or the like. According to example embodiments, the gate electrodes 130 may include polycrystalline silicon or a metal silicide material, or the like. In example embodiments, the gate electrodes 130 may further include a diffusion barrier, and, for example, the diffusion barrier may include tungsten nitride (WN), tantalum nitride (TaN), titanium nitride (TiN), or a combination thereof.

The interlayer insulating layers 120 may be disposed between the gate electrodes 130. Like the gate electrodes 130, the interlayer insulating layers 120 may be spaced apart from each other in a direction, perpendicular to the upper surface of the plate layer 101, and may be disposed to extend in the X-direction. The upper interlayer insulating layers 125 may be disposed between the first, second and third stack structures GS1, GS2, and GS3, and may have a thickness, respectively, equal to or greater than a thickness of each of the interlayer insulating layers 120. In example embodiments, arrangements of the interlayer insulating layers 120 and the upper interlayer insulating layers 125 may be variously changed. The interlayer insulating layers 120 and the upper interlayer insulating layers 125 may include an insulating material such as silicon oxide or silicon nitride, or the like.

The channel structures CH may form one memory cell string, respectively, and may be disposed to be spaced apart from each other while forming rows and columns on the plate layer 101 in the first region R1. The channel structures CH may be disposed to form a grid pattern on an X-Y plane, or may be disposed in a zigzag shape in one direction. The channel structures CH may have a columnar shape, and may have inclined side surfaces that become narrower toward the plate layer 101 according to an aspect ratio. According to example embodiments, at least some of the channel structures CH disposed in an end portion of the first region R1 may be dummy channels.

As illustrated in FIGS. 2B and 4, each of the channel structures CH may include first, second and third channel portions CH1, CH2, and CH3, vertically stacked. The first, second and third channel portions CH1, CH2, and CH3 may penetrate the first, second and third stack structures GS1, GS2, and GS3 of the gate structure GS, respectively. The channel structure CH may have a configuration in which the first channel portion CH1 and the second channel portion CH2 thereon are connected to each other, and the second channel portion CH2 and the third channel portion CH3 thereon are connected to each other. The first, second and third channel portions CH1, CH2, and CH3 may have a configuration in which a width of an upper surface of a channel portion, which may be present in lower portions, is wider than a width of a lower surface of a channel portion, which may be present in upper portions, in a region connected to each other. The channel structure CH may have bent portions due to a difference in widths in a region in which the first, second and third channel portions CH1, CH2, and CH3 are connected. According to example embodiments, the number of channel portions stacked in the Z-direction in the channel structure CH may be variously changed. The first channel portion CH1 may further penetrate the source structure SS, and a lower end of the first channel portion CH1 may be located in the plate layer 101.

Each of the channel structures CH may include a channel layer 140, a gate dielectric layer 145, a channel buried insulating layer 147, and a channel pad 149, disposed in a channel hole. As illustrated in the enlarged view of FIG. 2B, according to an example embodiment, although the channel layer 140 may be formed to have an annular shape surrounding the channel buried insulating layer 147 therein, the channel layer 140 may have a columnar shape such as a cylinder or a prism, without the channel buried insulating layer 147. The channel layer 140 may be connected to the first horizontal conductive layer 102 in a lower portion thereof. The channel layer 140 may include a semiconductor material such as polycrystalline silicon or single crystal silicon, or the like.

The gate dielectric layer 145 may be disposed between the gate electrodes 130 and the channel layer 140. The gate dielectric layer 145 may include a tunneling layer, a charge storage layer, and a blocking layer, sequentially stacked from the channel layer 140. The tunneling layer may tunnel charges into the charge storage layer, and may include, for example, silicon oxide ($SiO_2$), silicon nitride ($Si_3N_4$), silicon oxynitride (SiON), or a combination thereof. The charge storage layer may be a charge trapping layer or a floating gate conductive layer. The blocking layer may include silicon oxide ($SiO_2$), silicon nitride ($Si_3N_4$), silicon oxynitride (SiON), a high-x dielectric material, or a combination thereof. In example embodiments, at least a portion of the gate dielectric layer 145 may extend in a horizontal direction along the gate electrodes 130.

The channel pad 149 may be disposed on an upper end of the third channel portion CH3. The channel pad 149 may include, for example, doped polycrystalline silicon, or the like.

The channel layer 140, the gate dielectric layer 145, and the channel buried insulating layer 147 may be connected to each other between the first, second and third channel portions CH1, CH2, and CH3. The upper interlayer insulating layer 125 having a relatively thick thickness may be provided between the first channel portion CH1 and the second channel portion CH2 and between the second channel portion CH2 and the third channel portion CH3, respectively.

The support structures DCH may be disposed to be spaced apart from each other while forming rows and columns on the plate layer 101 in the second region R2. The support structures DCH may be referred to as dummy structures, and may serve to support the interlayer insulating layers 120 during a process of manufacturing the semiconductor device 100. According to an example embodiment, the support structures DCH may not be connected to the upper contact plugs 180. As illustrated in FIG. 1, according to an example embodiment, the support structures DCH may be disposed to surround each of the contact plugs 170 in four directions. In example embodiments, the arrangement of the support structures DCH may be variously changed. As illustrated in FIG. 2C, according to an example embodiment, the support structures DCH may have a columnar shape, and may have inclined side surfaces that become narrower toward the plate layer 101 according to an aspect ratio.

The support structures DCH may have a circular shape, an elliptical shape, or a similar shape in an X-Y plane. A diameter or a maximum width of each of the support structures DCH may be greater than that of each of the channel structures CH, but example embodiments are not limited thereto. The support structures DCH may have an internal structure, different from that of the channel structures CH. As used herein, the term "internal structure" may refer to the number of layers filling the interior and a material of each of the layers. According to an example embodiment, each of the support structures DCH may not include a conductive layer, and may include a support insulating layer 108. The support insulating layer 108 may include an insulating material such as silicon oxide, silicon nitride, or silicon oxynitride, or the like.

As illustrated in FIGS. 2C and 4, according to an example embodiment, the support structures DCH may have shapes corresponding to the channel structures CH. In the present specification, according to an example embodiment, "shapes corresponding to" may mean that specific forms are the same, but magnitudes, for example, sizes, such as widths, heights, or the like are the same or different. Each of the support structures DCH may include first, second and third support portions DCH1, DCH2, and DCH3. Each of the first, second and third support portions DCH1, DCH2, and DCH3 may penetrate at least one of the first, second and third stack structures GS1, GS2, and GS3 of the gate structure GS, or the cell region insulating layer 190, and may be disposed on substantially the same height level as each of the first, second and third channel units CH1, CH2, and CH3 of the channel structure CH. Similar to the channel structure CH, the support structure DCH may have bent portions due to a difference in width in a region in which the first, second and third support portions DCH1, DCH2, and DCH3 are connected. The first support portion DCH1 may further penetrate the second horizontal conductive layer 104, the horizontal insulating layer 110, and the plate layer 101, and a lower end of the first support portion DCH1 may be located in the plate layer 101.

The first separation regions MS1, and the second separation regions MS1, MS2a, and MS2b may be disposed to penetrate the gate electrodes 130 and extend in the X-direction. As illustrated in FIG. 1, the first separation region MS1, and the second separation regions MS2a and MS2b may be disposed to be parallel to each other. The first separation regions MS1 may extend as a single layer in the X-direction, and the second separation regions MS2a and MS2b may be arranged to intermittently extend between a pair of first separation regions MS1 or only in some regions. For example, a second central separation regions MS2a may extend as a single layer in the first region R1, and may intermittently extend in the X-direction in the second region R2. A second auxiliary separation region MS2b may be disposed only in the second region R2, and may intermittently extend in the X-direction. In example embodiments, the arrangement order and the number of the first separation regions MS1, and second separation regions MS2a and MS2b are not limited to those illustrated in FIG. 1.

As illustrated in FIGS. 2B and 2C, according to an example embodiment, the first separation regions MS1, and the second separation regions MS2a and MS2b, may entirely penetrate the gate structure GS stacked on the plate layer 101, and may further penetrate the first and second horizontal conductive layers 102 and 104 and the horizontal insulating layer 110 therebelow, to be connected to the plate layer 101. The first separation regions MS1, and the second separation regions MS2a and MS2b, may have shapes wherein widths decrease toward the plate layer 101 due to a high aspect ratio. For example, according to an example embodiment, side surfaces of the first separation regions MS1, and the second separation regions MS2*a* and MS2*b*, may be inclined side surfaces of a substantially constant inclination such that widths continuously or consecutively decrease, and may not have bent portions on the side surfaces.

Each of the first separation regions MS1, and the second separation regions MS2*a* and MS2*b*, may include a separation insulating layer 105. The separation insulating layer 105 may include an insulating material, and may include, for example, silicon oxide, silicon nitride, or silicon oxynitride, or the like.

As illustrated in FIG. 1, according to an example embodiment, the upper separation regions US may extend between the first separation regions MS1 and the second central separation region MS2*a*, and between the second central separation regions MS2*a* in the first region R1 in the X-direction. The upper separation regions US may be disposed in a portion of the second region R2 and the first region R1, to penetrate a portion of the gate electrodes 130 including an uppermost upper gate electrode 130U, among the gate electrodes 130. As illustrated in FIG. 2B, according to an example embodiment, the upper separation regions US may separate, for example, a total of three gate electrodes 130 from each other in the Y-direction. The number of gate electrodes 130 separated by the upper separation regions US may be variously changed according to example embodiments. The upper separation regions US may include an upper separation insulating layer 103. The upper separation insulating layer 103 may include an insulating material, and may include, for example, silicon oxide, silicon nitride, or silicon oxynitride, or the like.

The contact plugs 170 may be connected to pad regions 130P of uppermost gate electrodes 130 in the second region R2. The contact plugs 170 may penetrate at least a portion of the cell region insulating layer 190, and may be connected to each of the pad regions 130P of the gate electrodes 130 exposed in an upward direction. The contact plugs 170 may penetrate gate electrodes 130 below the pad regions 130P, and may penetrate the horizontal insulating layer 110, the second horizontal conductive layer 104, and the plate layer 101, to be connected to the lower interconnection lines 280 in the peripheral circuit region PERI. The contact plugs 170 may be spaced apart from the gate electrodes 130 below the pad regions 130P by contact insulating layers 160. The contact plugs 170 may be spaced apart from the plate layer 101, the horizontal insulating layer 110, and the second horizontal conductive layer 104 by the substrate insulating layers 121.

As illustrated in FIGS. 3 and 4, according to an example embodiment, the contact plugs 170 may have shapes corresponding to the channel structures CH. Each of the contact plugs 170 may include first, second and third contact portions 170_1, 170_2, and 170_3, stacked from a lower portion thereof, and a fourth contact portion 170_4 below the first contact portion 170_1. Each of the first, second and third contact portions 170_1, 170_2, and 170_3 may penetrate at least one of the first, second and third stack structures GS1, GS2, and GS3 of the gate structure GS or the cell region insulating layer 190. The first contact portion 170_1 may further penetrate the substrate insulating layer 121. Each of the first, second, third and fourth contact portions 170_1, 170_2, 170_3, and 170_4 may have a cylindrical shape wherein a width decreases toward the substrate 201 due to an aspect ratio. Each of the first, second, third and fourth contact portions 170_1, 170_2, 170_3, and 170_4 may have a substantially constant inclination.

The first contact portion 170_1 may be disposed on a height level of the first channel portion CH1 of the channel structure CH, and may extend further below the first channel portion CH1. The first contact portion 170_1 may include a region located on the same height level as the source structure SS. A height level of an upper surface of the first contact portion 170_1 may be substantially the same as a height level of an upper surface of the first channel portion CH1. The second and third contact portions 170_2 and 170_3 may be disposed on substantially the same height levels as the second and third channel portions CH2 and CH3 of the channel structure CH, respectively. The fourth contact portion 170_4 may penetrate the second peripheral region insulating layer 294 and the lower protective layer 295, to be connected to the third lower interconnection line 286, which may be an uppermost portion, among the lower interconnection lines 280. The fourth contact portion 170_4 may overlap the ground via 250 in the X-direction. The fourth contact portion 170_4 may be disposed on substantially the same height level as the ground via 250. According to example embodiments, the fourth contact portion 170_4 may be disposed by partially recessing an upper surface of the third lower interconnection line 286. The third lower interconnection line 286 connected to the fourth contact portion 170_4 may have an island shape in plan view, and may be disposed to be spaced apart from an adjacent third lower interconnection line 286, but example embodiments are not limited thereto.

The first, second, third and fourth contact portions 170_1, 170_2, 170_3, and 170_4 may have a configuration in which a width of an upper surface of a contact portion, which may be present in lower portions, is wider than a width of a lower surface of a contact portion, which may be present in upper portions, in a region connected to each other. Specifically, as illustrated in FIG. 3, the first contact portion 170_1 may have a first diameter or a first width W1 on a lower end or a lower surface, and may have a second width W2, wider than the first width W1, on an upper end or an upper surface. The second contact portion 170_2 may have a third width W3, narrower than the second width W2, on a lower surface, and may have a fourth width W4, wider than the third width W3, on an upper surface. The third contact portion 170_3 may have a fifth width W5, narrower than the fourth width W4, on a lower surface, and may have a sixth width W6, wider than the fifth width W5, on an upper surface. The fourth contact portion 170_4 may have a seventh width W7 on a lower surface, and may have an eighth width W8, equal to or wider than the seventh width W7 and wider than the first width W1, on an upper surface. Therefore, similar to the channel structure CH, the contact plug 170 may also have bent portions due to a difference in width in a region in which the first, second and third contact portions 170_1, 170_2, and 170_3 are connected. The contact plug 170 may have a sudden change in width in the bent portions, and may include a region of which a side surface extends horizontally. A relationship between the widths W1, W2, W3, W4, W5, and W6 in the first, second and third contact portions 170_1, 170_2, and 170_3 may be similarly applied to the channel structure CH and the support structure DCH.

Each of the contact plugs 170 may include a barrier layer 172, a first conductive layer 174, and a second conductive layer 176, sequentially stacked from an inner side surface and a bottom surface of a contact hole. The barrier layer 172, the first conductive layer 174, and the second conductive layer 176 may continuously extend in the first, second, third and fourth contact portions 170_1, 170_2, 170_3, and 170_4.

The barrier layer 172 may have a first thickness T1, the first conductive layer 174 may have a second thickness T2, equal to or greater than the first thickness T1, and the second conductive layer 176 may have a third thickness T3, equal to or greater than the second thickness T2. In example embodiments, a relative magnitude between a thickness of the first conductive layer 174 and a thickness of the second conductive layer 176 may be changed. For example, according to example embodiments, the barrier layer 172 may have a first thickness T1, the second conductive layer 176 may have a third thickness T3, equal to or greater than the first thickness T1, and the first conductive layer 174 may have a second thickness T2, equal to or greater than the third thickness T3. The second conductive layer 176 may include voids S1, S2, S3, and S4 therein. The voids S1, S2, S3, and S4 may be referred to as an air gap or a seam. The voids S1, S2, S3, and S4 may be formed in the first, second, third and fourth contact portions 170_1, 170_2, 170_3, and 170_4, respectively, and may be spaced apart from each other in the Z-direction.

The barrier layer 172 may function as a diffusion barrier layer, and may include at least one of titanium (Ti), titanium nitride (TiN), tantalum (Ta), tantalum nitride (TaN), tungsten nitride (WN), or a combination thereof.

The first conductive layer 174 may include a material, different from that of the barrier layer 172 and the second conductive layer 176. For example, the first conductive layer 174 may include a material having a lower resistivity than the second conductive layer 176. For example, the first conductive layer 174 may include a material having a lower resistivity than the barrier layer 172. For example, the first conductive layer 174 may include at least one of tungsten (W), molybdenum (Mo), copper (Cu), or aluminum (Al), or the like.

According to an example embodiment, the second conductive layer 176 may not include tungsten (W), and may include at least one of titanium nitride (TiN), tantalum nitride (TaN), or a combination thereof. According to example embodiments, the second conductive layer 176 may include the same material as the barrier layer 172.

At least a portion of the voids S1, S2, S3, and S4 may contain fluorine (F) or hydrogen fluoride (HF). The second conductive layer 176 may prevent diffusion of fluorine (F) or hydrogen fluoride (HF) in the voids S1, S2, S3, and S4 into the interlayer insulating layers 120 and the cell region insulating layer 190. Fluorine (F) may remain from, for example, a source material supplied to form the first conductive layer 174, for example, tungsten hexafluoride ($WF_6$), when the first conductive layer 174 includes tungsten (W). When fluorine (F) is diffused into the interlayer insulating layers 120 and the cell region insulating layer 190, the fluorine (F) may melt the interlayer insulating layers 120 and the cell region insulating layer 190, to cause an electrical short between the gate electrodes 130 and the contact plug 170, or loss of a material of the contact plug 170 on an upper end of the contact plug 170. In this example embodiment, the above phenomena may be addressed, because the second conductive layer 176 may be disposed on the first conductive layer 174 to surround the voids S1, S2, S3, and S4, to help prevent diffusion of fluorine (F) in the voids S1, S2, S3, and S4.

As illustrated in FIGS. 2A and 3, according to an example embodiment, each of the contact plugs 170 may include a vertical extension portion 170V extending in the Z-direction, and a horizontal extension portion 170H extending horizontally in the X-direction and the Y-direction from the vertical extension portion 170V and contacting the pad regions 130P. The horizontal extension portion 170H may be disposed along a circumference of the vertical extension portion 170V, and a length from a side surface of the vertical extension portion 170V to the other end portion may be shorter than a length of the contact insulating layers 160 therebelow. A length of the horizontal extension portion 170H may be variously changed in example embodiments. The horizontal extension portion 170H may be in contact with a region in which the gate electrode 130 has a relatively increased thickness.

As described above, according to an example embodiment, the vertical extension portion 170V may include a barrier layer 172, a first conductive layer 174, and a second conductive layer 176, sequentially stacked. The horizontal extension portion 170H may include only the barrier layer 172 and the first conductive layer 174. Because the horizontal extension portion 170H extends horizontally to have a relatively low height, an inner space thereof may be completely filled with the first conductive layer 174 on the barrier layer 172.

The substrate contacts 173 may be disposed outside the gate electrodes 130, and may electrically connect the source structure SS and the upper contact plugs 180. The substrate contacts 173 may penetrate the cell region insulating layer 190, the second horizontal conductive layer 104, and the horizontal insulating layer 110. The substrate contacts 173 may be disposed on the same or similar height level to the channel structures CH.

Each of the substrate contacts 173 may have a shape corresponding to or the same shape as the first, second and third contact portions 170_1, 170_2, and 170_3 of the contact plug 170 or the channel structure CH. The substrate contacts 173 may be deposited in the same process as the contact plugs 170 and the through-vias 175, to have the same internal structure and material as the contact plugs 170 and the through-vias 175.

The through-vias 175 may be disposed outside the source structure SS, for example, the plate layer 101, and may penetrate the memory cell region CELL to extend into peripheral circuit region PERI. The through-vias 175 may be disposed to connect the upper contact plugs 180 of the memory cell region CELL and the lower interconnection lines 280 of the peripheral circuit region PERI. The through-vias 175 may penetrate the cell region insulating layer 190, the substrate insulating layer 121, and the second peripheral region insulating layer 294. According to example embodiments, the through-vias 175 may be disposed to penetrate a mold structure KS of sacrificial insulating layers 118 (refer to the example embodiment shown in FIG. 11E) and the interlayer insulating layers 120 (refer to the example embodiment shown in FIG. 11E), in a region in which the sacrificial insulating layers 118, which are not replaced with the gate electrodes 130, remain. The through-vias 175 may be disposed on substantially the same height level as the contact plugs 170, but example embodiments are not limited thereto.

The through-vias 175 may have a shape corresponding to, or a shape the same as, that of the contact plugs 170. Each of the through-vias 175 may include first, second, third and fourth via portions 175_1, 175_2, 175_3, and 175_4. The first, second and third via portions 175_1, 175_2, and 175_3 may penetrate the cell region insulating layer 190, and the fourth via portion 175_4 may penetrate the second peripheral region insulating layer 294 and the lower protective layer 295. The first, second, third and fourth via portions 175_1, 175_2, 175_3, and 175_4 may be located on substantially the same height level as each of the first, second, third and fourth contact portions 170_1, 170_2, 170_3, and 170_4. Similar to the contact plug 170, the first, second, third and fourth via portions 175_1, 175_2, 175_3, and 175_4 may have a configuration in which a width of an upper surface of a via portion, which may be present in lower portions, is wider than a width of a lower surface of a via portion, which may be present in upper portions, in a region for connection thereof.

The through-vias 175 may be deposited in the same process as the contact plugs 170, and may have the same internal structure as the contact plugs 170, and thus may include the same material. Each of the through-vias 175 may include a barrier layer 172, a first conductive layer 174, and a second conductive layer 176, sequentially stacked from inner side and bottom surfaces of a via hole, respectively. For, the above-described descriptions of the barrier layer 172, the first conductive layer 174, and the second conductive layer 176 may be similarly applied.

As illustrated in FIG. 4, according to an example embodiment, in the channel structure CH, the contact plug 170, the through-via 175, and the support structure DCH, upper ends or upper surfaces of the first channel portion CH1, the first contact portion 170_1, the first via portion 175_1, and the first support portion DCH1, which may be first portions, may be located on substantially the same height level. Lower ends or lower surfaces of the first portions may be located on different height levels. Lower surfaces of the first channel portion CH1 and the first support portion DCH1 may be located on a higher height level than lower surfaces of the first contact portion 170_1 and the first via portion 175_1. The second channel portion CH2, the second contact portion 170_2, the second via portion 175_2, and the second support portion DCH2, which may be second portions, may be located on substantially the same height level. The third channel portion CH3, the third contact portion 170_3, the third via portion 175_3, and the third support portion DCH3, which may be third portions, may be located on substantially the same height level. according to an example embodiment, the substrate contacts 173 may also have first, second and third portions disposed on height levels corresponding to the channel structure CH and the support structure DCH.

The upper contact plugs 180 may constitute a cell interconnection structure electrically connected to memory cells in the memory cell region CELL. The upper contact plugs 180 may be connected to the channel structures CH, the contact plugs 170, the substrate contacts 173, and the through-vias 175. The upper contact plugs 180 are illustrated in the form of a plug, but example embodiments are not limited thereto, and the upper contact plugs 180 may have a linear form. In example embodiments, the number of plugs and interconnection lines constituting the cell interconnection structure may be variously changed. The upper contact plugs 180 may include metal, and may include, for example, tungsten (W), copper (Cu), aluminum (Al), or the like.

The cell region insulating layer 190 may be disposed to cover the gate structure GS, the contact plugs 170, and the substrate insulating layer 121. The cell region insulating layer 190 may be formed of an insulating material, or may be formed as a plurality of insulating layers.

Figure 5A:
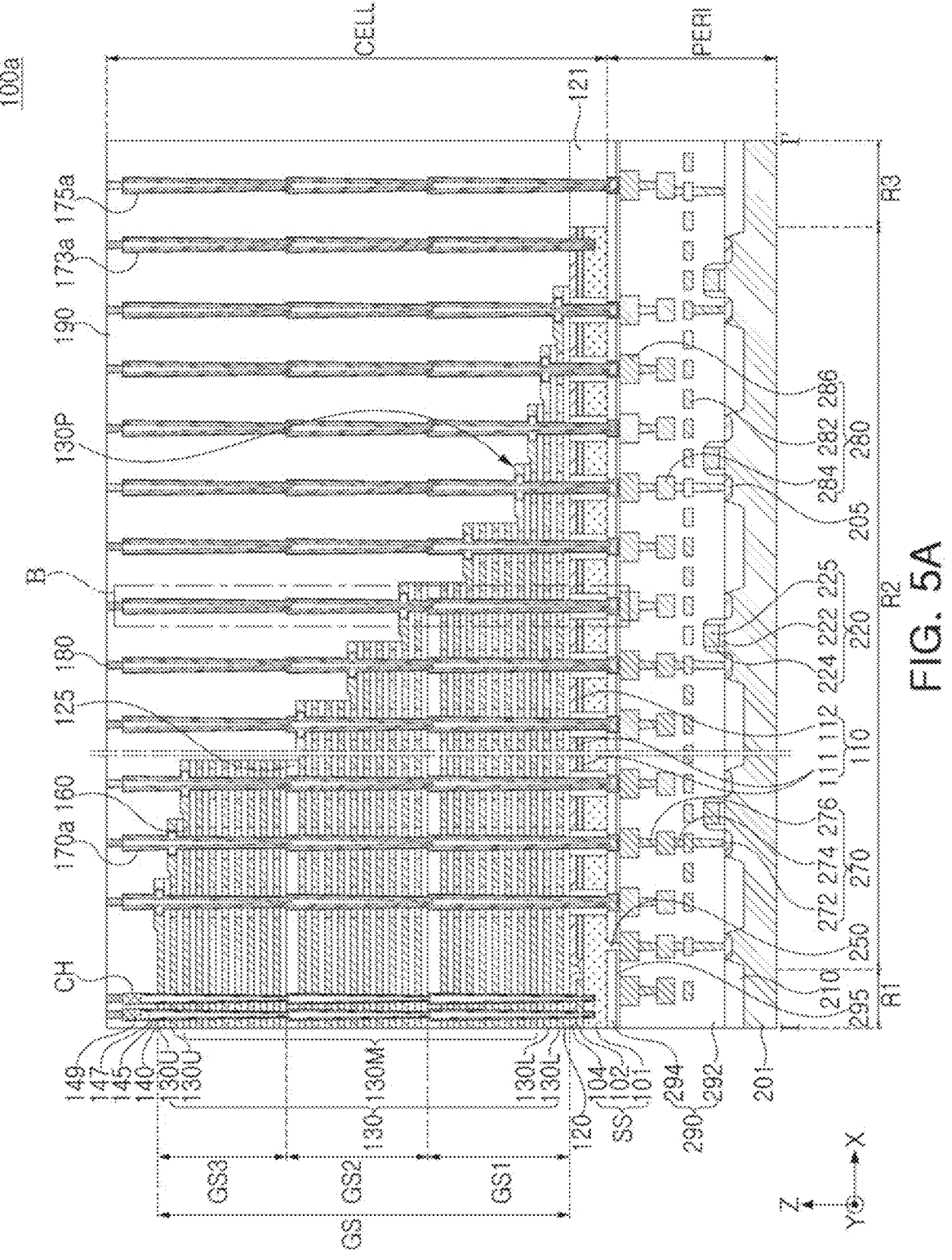
FIGS. 5A and 5B are schematic cross-sectional views and partially enlarged views of a semiconductor device according to example embodiments.
Figure 5B:
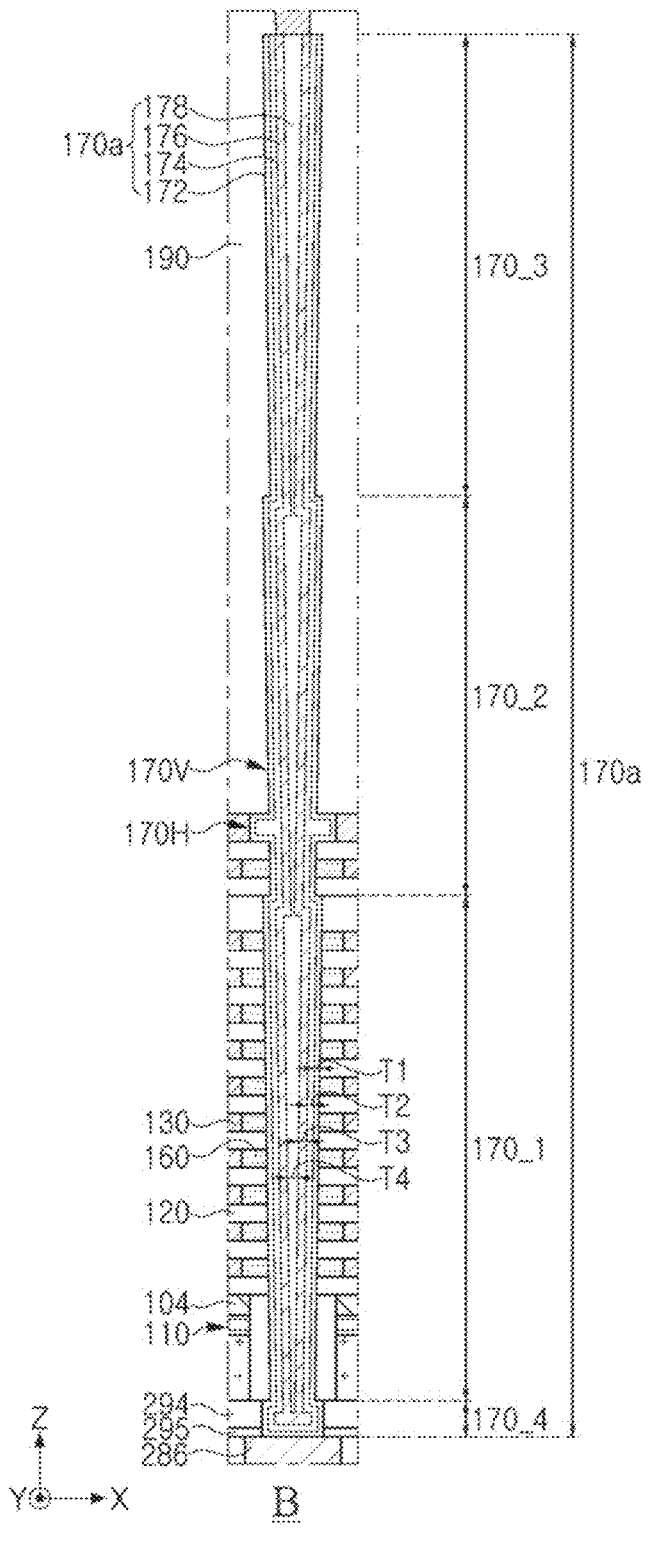

FIGS. 5A and 5B are schematic cross-sectional views and partially enlarged views of a semiconductor device according to example embodiments. FIGS. 5A and 5B illustrate regions corresponding to FIGS. 2A and 3, respectively.

Referring to the example embodiments shown in FIGS. 5A and 5B, in a semiconductor device 100a, internal structures of contact plugs 170a, substrate contacts 173a, and through-vias 175a may be different from those illustrated in the example embodiment of FIGS. 2A, 2B, 2C, 3 and 4.

Each of the contact plugs 170a may include a barrier layer 172, a first conductive layer 174, a second conductive layer 176, and a third conductive layer 178, sequentially stacked from inner side and bottom surfaces of a contact hole. The barrier layer 172 may have a first thickness T1, the first conductive layer 174 may have a second thickness T2, equal to or greater than the first thickness T1, the second conductive layer 176 may have a third thickness T3, equal to or different from the second thickness T2, and the third conductive layer 178 may have a fourth thickness T4 inside the second conductive layer 176. The fourth thickness T4 may correspond to a width of the third conductive layer 178, and may be equal to or different from the third thickness T3.

The third conductive layer 178 may include a material, different from those of the barrier layer 172, the first conductive layer 174, and the second conductive layer 176. According to an example embodiment, the third conductive layer 178 may not include tungsten (W). The third conductive layer 178 may include a material having excellent gap-fill properties. For example, the third conductive layer 178 may be a semiconductor layer, and may include, for example, polycrystalline silicon (Si), or the like. The third conductive layer 178 may fill at least a portion of voids S1, S2, S3, and S4 (refer to FIG. 3), and may thus not include the voids S1, S2, S3, and S4 therein. According to example embodiments, the third conductive layer 178 may include the voids S1, S2, S3, and S4 therein.

The substrate contacts 173a and the through-vias 175a may also have the same internal structure as the contact plugs 170a described above.

Figure 6A:
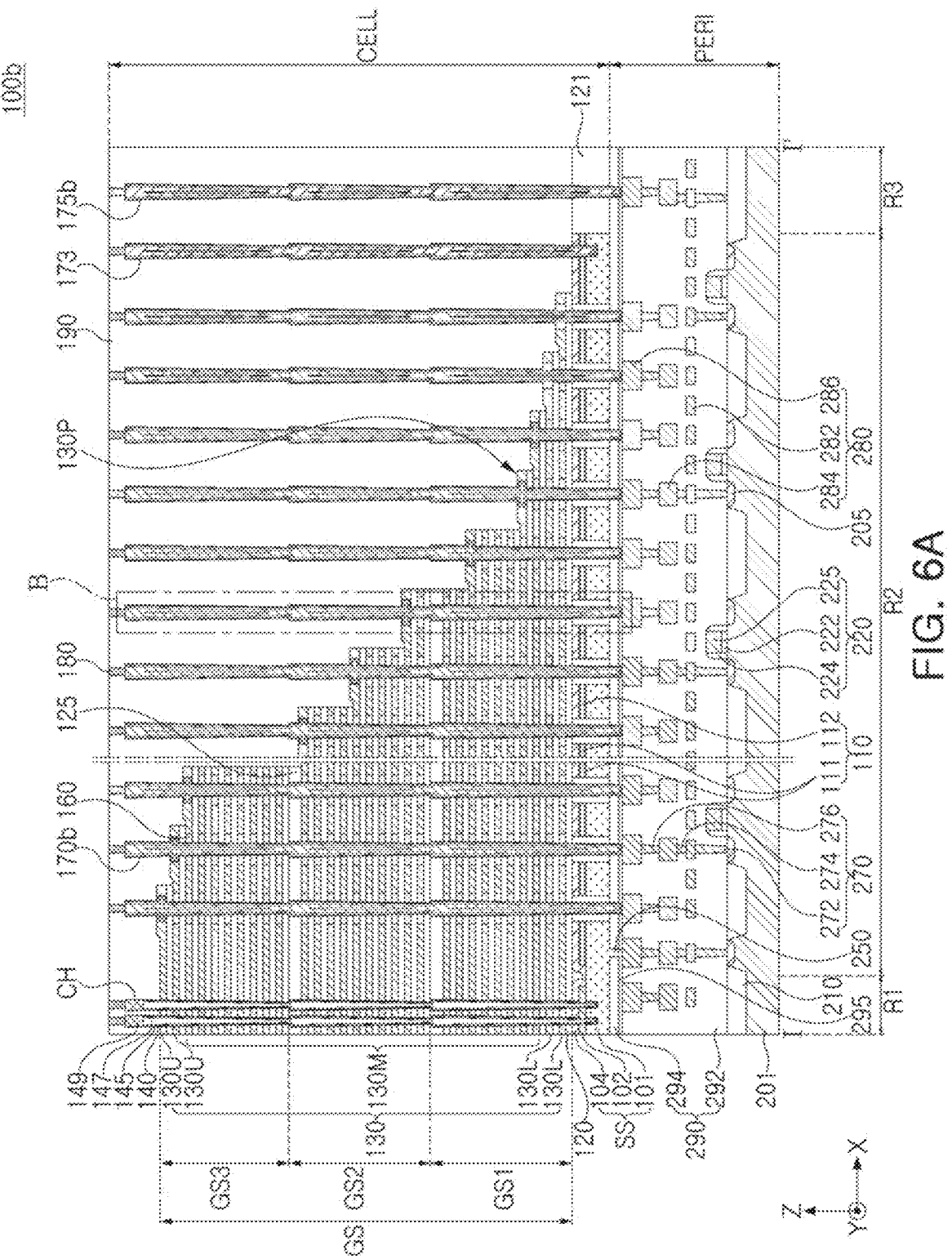
FIGS. 6A and 6B are schematic cross-sectional views and partially enlarged views of a semiconductor device according to example embodiments.
Figure 6B:
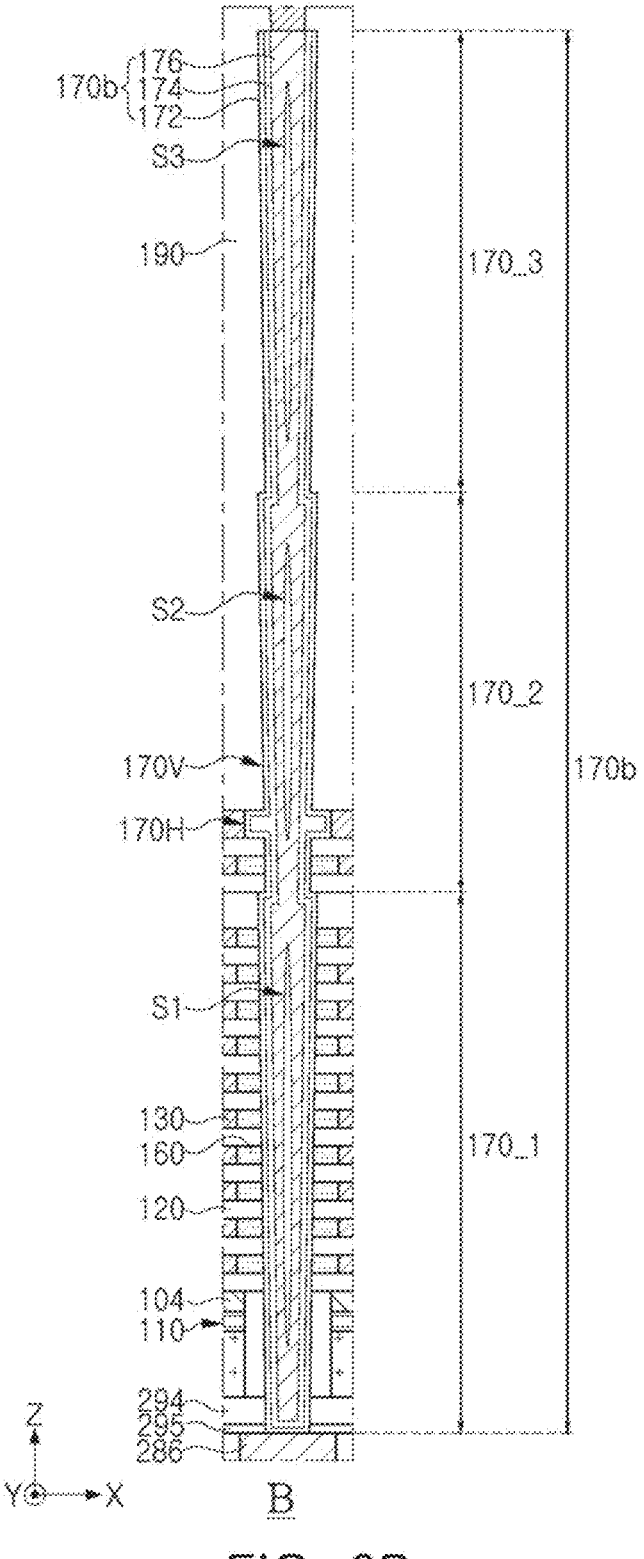

FIGS. 6A and 6B are schematic cross-sectional views and partially enlarged views of a semiconductor device according to example embodiments. FIGS. 6A and 6B illustrate regions corresponding to FIGS. 2A and 3, respectively.

Referring to the example embodiments shown in FIGS. 6A and 6B, in a semiconductor device 100b, shapes of contact plugs 170b and through-vias 175b may be different from those of the example embodiment of FIGS. 2A, 2B, 2C, 3 and 4.

According to an example embodiment, each of the contact plugs 170b may include first, second and third contact portions 170_1, 170_2, and 170_3, stacked vertically, and may not include a fourth contact portion 170_4 (refer to an example embodiment shown in FIG. 3). In the present example embodiment, the first contact portion 170_1 may further penetrate a second peripheral region insulating layer 294 and a lower protective layer 295, to be connected to a third lower interconnection line 286, which may be an uppermost portion, among lower interconnection lines 280. In some example embodiments, the first contact portion 170_1 may be disposed to recess an upper surface of the third lower interconnection line 286.

According to an example embodiment, the through-vias 175b may also have a shape corresponding to the contact plugs 170b described above.

Figure 7A:
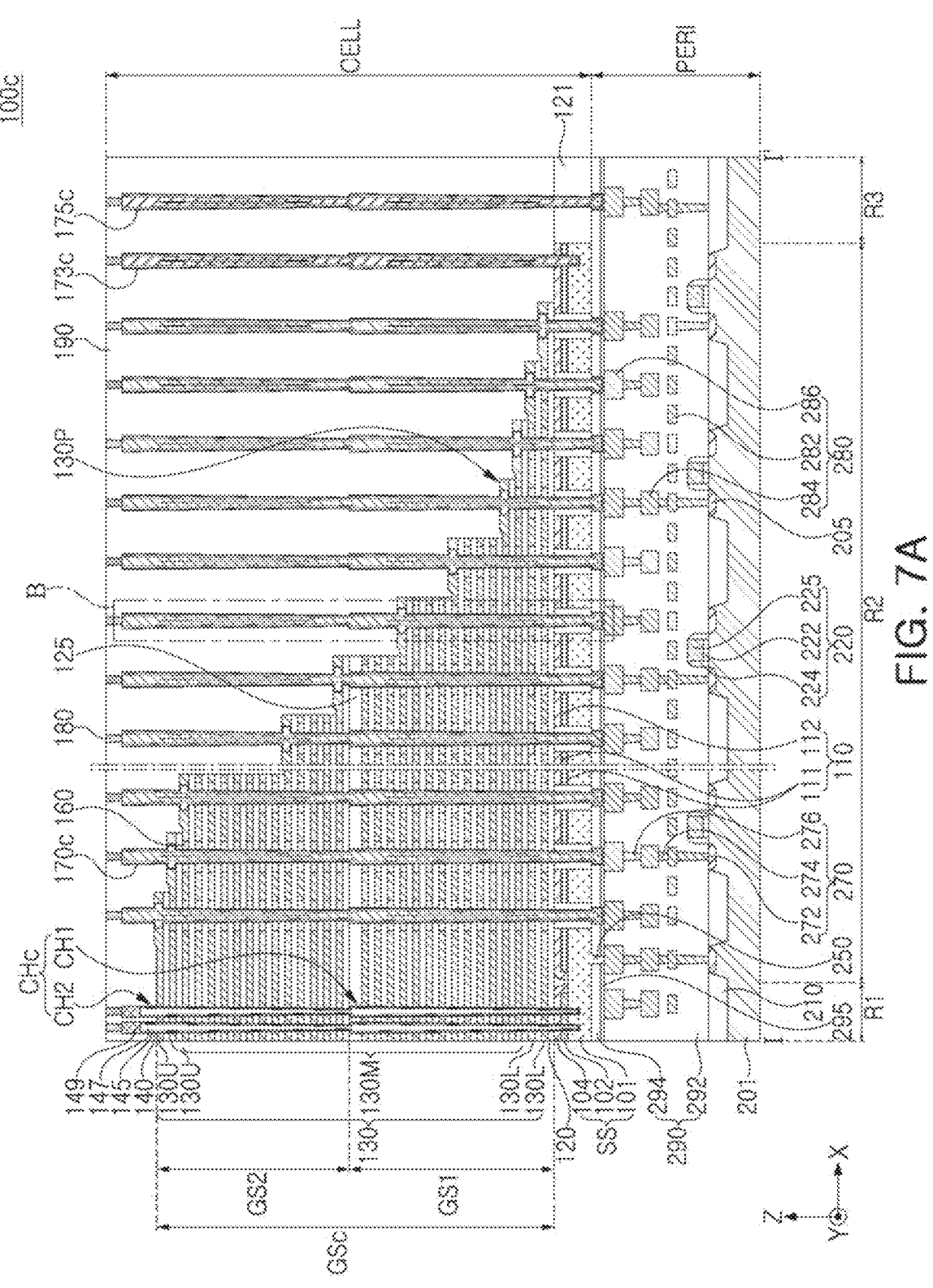
FIGS. 7A and 7B are schematic cross-sectional views and partially enlarged views of a semiconductor device according to example embodiments.
Figure 7B:
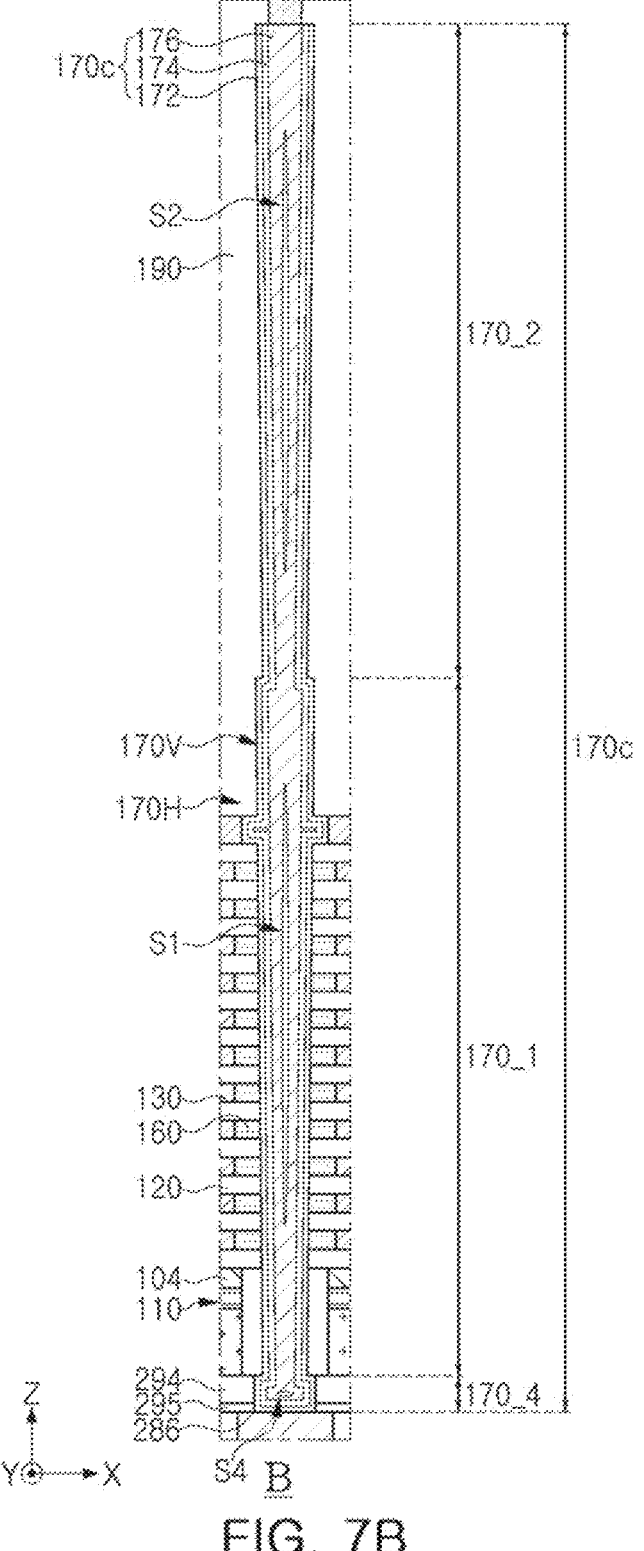

FIGS. 7A and 7B are schematic cross-sectional views and partially enlarged views of a semiconductor device according to example embodiments. FIGS. 7A and 7B illustrate regions corresponding to FIGS. 2A and 3, respectively, according to an example embodiment.

Referring to the example embodiment shown in FIGS. 7A and 7B, in a semiconductor device 100c, a gate structure GSc, channel structures CHc, contact plugs 170c, substrate contacts 173*c*, and through-vias 175*c* may be different from those of the example embodiments of FIGS. 2A, 2B, 2C, 3 and 4.

The gate structure GSc may include first and second stack structures GS1 and GS2, vertically stacked. Each of the channel structures CHc may include first and second channel portions CH1 and CH2 penetrating the first and second stack structures GS1 and GS2, respectively. According to an example embodiment, support structures DCH (refer to FIG. 2C) may also have shapes corresponding to the channel structures CHc.

Each of the contact plugs 170*c* may include first and second contact portions 170_1 and 170_2, stacked in the Z-direction, and a fourth contact portion 170_4 below the first contact portion 170_1. Each of the first and second contact portions 170_1 and 170_2 may penetrate the first and second stack structures GS1 and GS2 of the gate structure GSc, or may penetrate the first stack structure GS1 and a cell region insulating layer 190. The first and second contact portions 170_1 and 170_2 and the fourth contact portion 170_4 may have a configuration in which a width of an upper surface of a contact portion, which may be present in lower portions, is wider than a width of a lower surface of a contact portion, which may be present in upper portions, in a region connected to each other. The substrate contacts 173*c* and the through-vias 175*c* may also have shapes corresponding to the contact plugs 170*c*.

As such, in example embodiments, the number of stack structures forming the gate structure GSc may be variously changed, and accordingly, the number of portions respectively stacked in the Z-direction in the channel structures CHc, the contact plugs 170*c*, the substrate contacts 173*c*, and the through-vias 175*c* may be variously changed.

Figure 8:
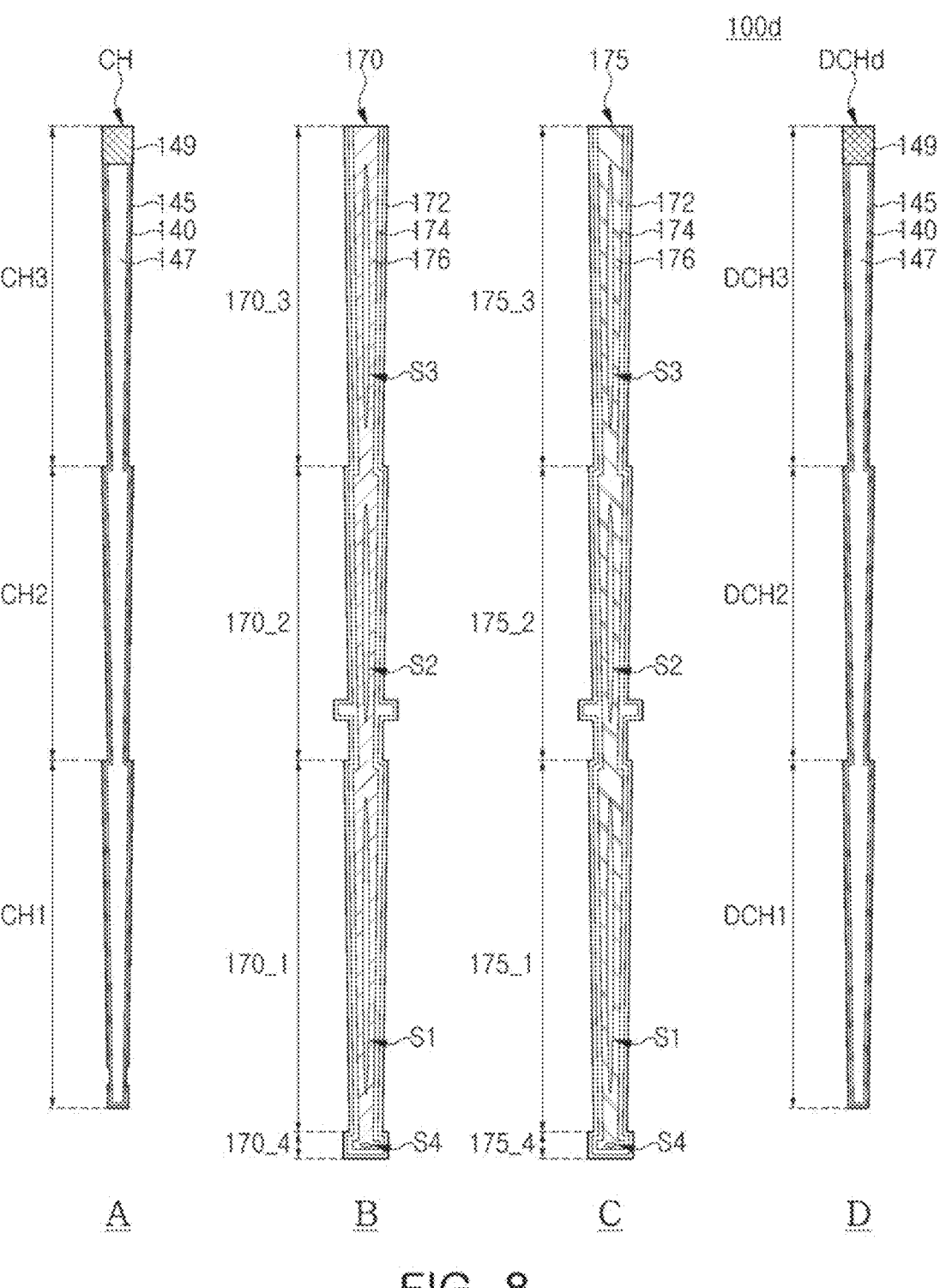
FIG. 8 is a schematic partially enlarged view of a semiconductor device according to example embodiments.

FIG. 8 is a schematic partially enlarged view of a semiconductor device according to example embodiments. FIG. 8 illustrates configurations corresponding to FIG. 4.

Referring to the example embodiment shown in FIG. 8, in a semiconductor device 100*d*, a support structure DCHd may have an internal structure, different from that of the example embodiments of FIGS. 2C and 4.

The support structure DCHd may have the same internal structure as a channel structure CH. Therefore, the support structure DCHd may include a channel layer 140, a gate dielectric layer 145, a channel buried insulating layer 147, and a channel pad 149 disposed in a dummy hole. For each of the channel layer 140, the gate dielectric layer 145, the channel buried insulating layer 147, and the channel pad 149, the descriptions described above with reference to FIGS. 1, 2, 3, and 4 may be similarly applied. According to an example embodiment, unlike the channel structure CH, the support structure DCHd may not be connected to a first horizontal conductive layer 102 (refer to FIG. 2A) in a lower portion thereof. Therefore, the support structure DCHd may not include a region from which the gate dielectric layer 145 is partially removed.

Figure 9:
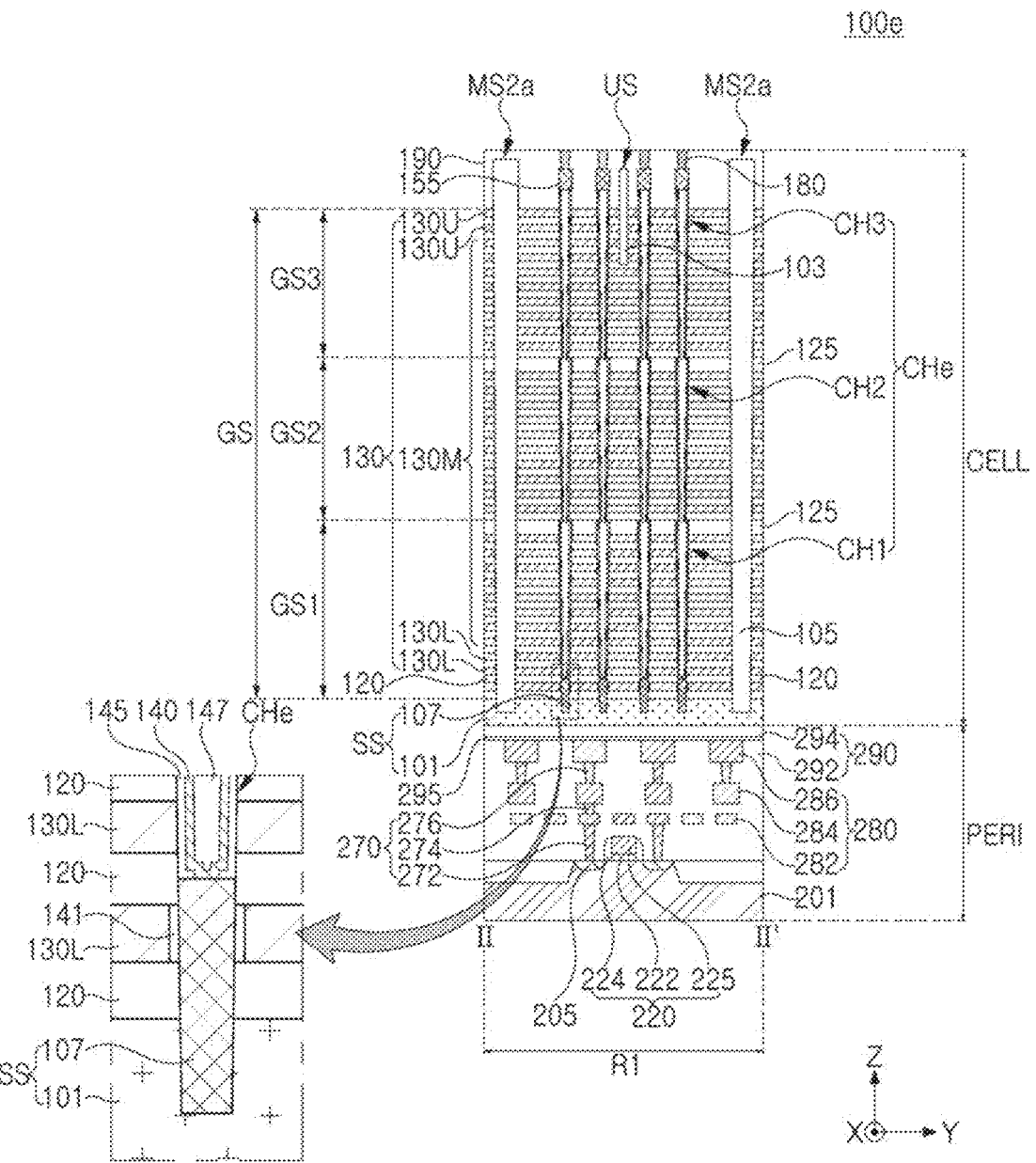
FIG. 9 is a schematic cross-sectional view of a semiconductor device according to example embodiments.

FIG. 9 is a schematic cross-sectional view of a semiconductor device according to example embodiments. FIG. 9 illustrates a region corresponding to FIG. 2B, according to an example embodiment.

Referring to FIG. 9, according to an example embodiment, in a semiconductor device 100*e*, a memory cell region CELL may not include first and second horizontal conductive layers 102 and 104 on a plate layer 101, unlike in the example embodiment of FIGS. 2A, 2B and 2C. In addition, channel structures CHe may further include an epitaxial layer 107 located in a first channel portion CH1, respectively.

The epitaxial layer 107 may be disposed on the plate layer 101 on a lower end of the first channel portion CH1, and may form a source structure SS, together with the plate layer 101. The epitaxial layer 107 may be disposed on a side surface of at least one lower gate electrode 130L. The epitaxial layer 107 may be disposed in a region in which the plate layer 101 is recessed. A height level of a lower surface of the epitaxial layer 107 may be higher than a height level of an upper surface of a lowermost lower gate electrode 130L, and may be lower than a height level of a lower surface of an upper lower gate electrode 130L on the lowermost lower gate electrode 130L, but example embodiments are not limited thereto. The epitaxial layer 107 may be connected to the channel layer 140 through an upper surface of the epitaxial layer 107. A gate insulating layer 141 may be further disposed between the epitaxial layer 107 and a lower gate electrode 130L contacting the epitaxial layer 107.

Such a shape of the channel structure CHe may be applicable to other example embodiments.

Figure 10A:
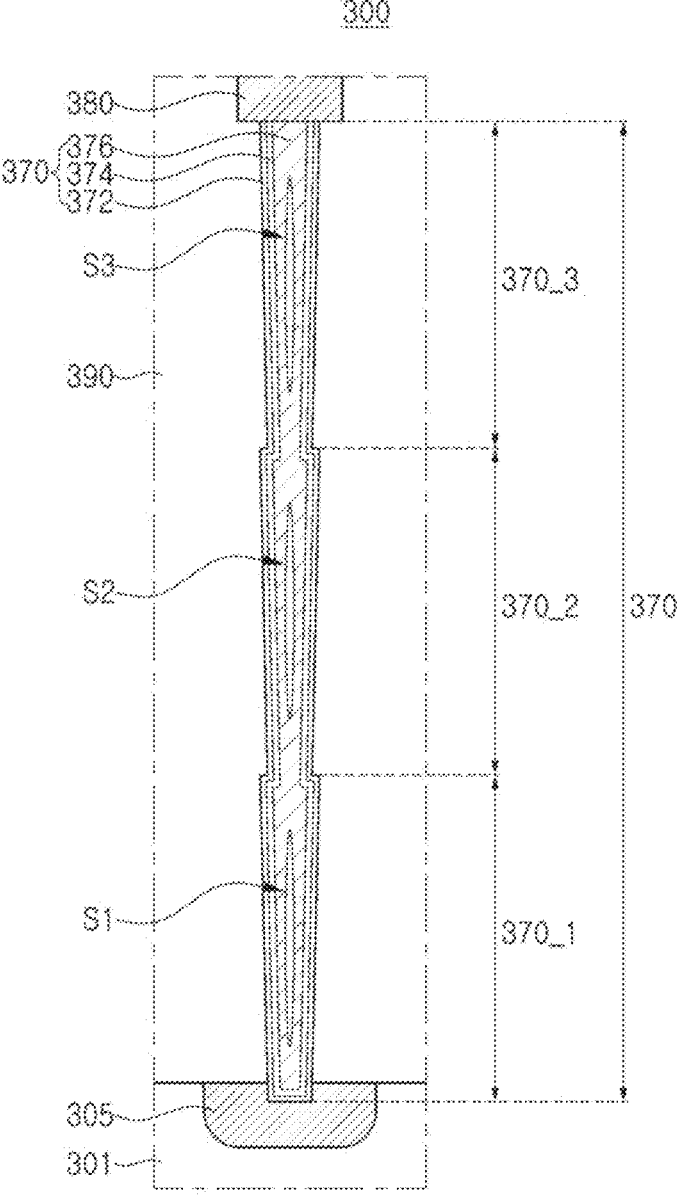
FIGS. 10A and 10B are schematic cross-sectional views of a semiconductor device according to example embodiments.
Figure 10B:
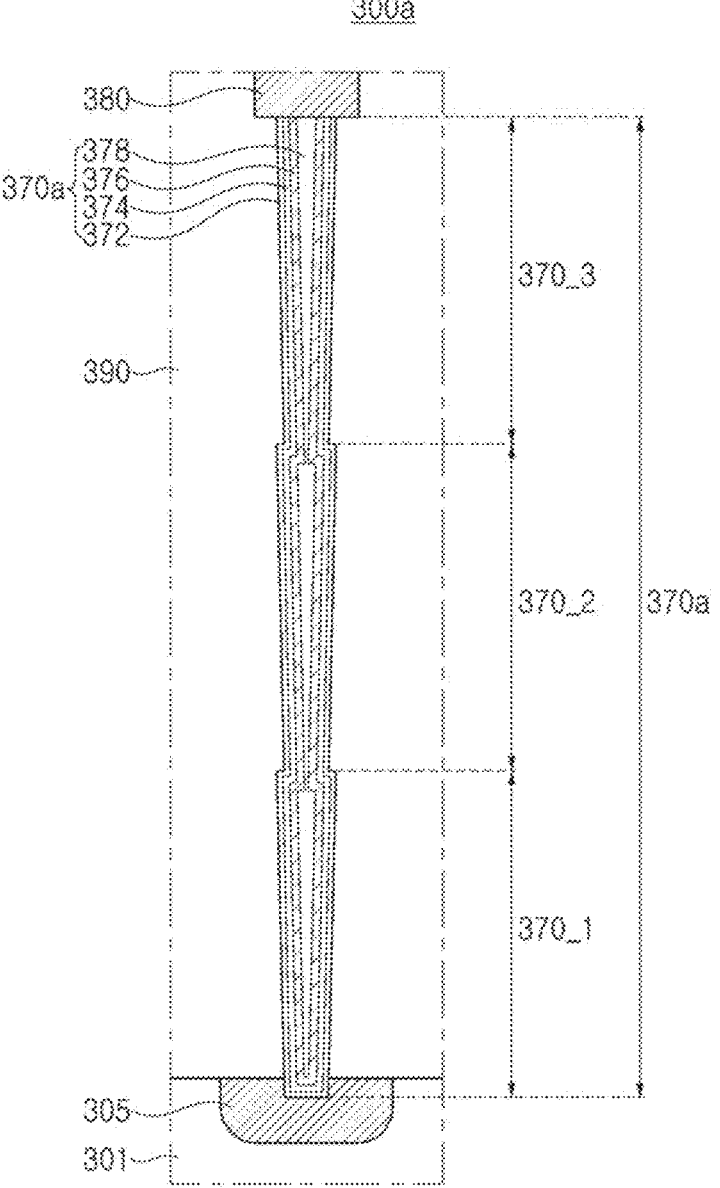

FIGS. 10A and 10B are schematic cross-sectional views of a semiconductor device according to example embodiments.

Referring to the example embodiment shown in FIG. 10A, a semiconductor device 300 may include a substrate 301, a conductive layer 305 in the substrate 301, a contact plug 370 connected to the conductive layer 305, an interconnection line 380 on the contact plug 370, and an insulating layer 390 surrounding the contact plug 370.

The substrate 301 may include a semiconductor material, or the like. The conductive layer 305 may be located in the substrate 301, and may be, for example, an impurity region including impurities or an interconnection structure in the substrate 301. The substrate 301 and the conductive layer 305 may form a semiconductor structure, and the semiconductor structure may include at least a portion of a memory device or a logic device.

The contact plug 370 may electrically connect the conductive layer 305 and the interconnection line 380. The contact plug 370 may extend through the insulating layer 390 in the Z-direction, and may include first, second and third contact portions 370_1, 370_2, and 370_3, stacked in the Z-direction. Each of the first, second and third contact portions 370_1, 370_2, and 370_3 may have a cylindrical shape in which a width decreases toward the substrate 301 due to an aspect ratio. The first, second and third contact portions 370_1, 370_2, and 370_3 may have substantially constant inclinations, and the inclinations may be the same or different from each other. The first, second and third contact portions 370_1, 370_2, and 370_3 may have a configuration in which a width of an upper surface of a contact portion, which may be present in lower portions, is wider than a width of a lower surface of a contact portion, which may be present in upper portions, in a region connected to each other. The contact plug 370 may have bent portions on a side surface according to a change in width.

The contact plug 370 may include a barrier layer 372, a first conductive layer 374, and a second conductive layer 376, sequentially stacked from inner side and bottom surfaces of a contact hole. The second conductive layer 376 may include voids S1, S2, and S3, spaced apart from each other, therein. According to example embodiments, for a thickness, a material, and the like of each of the barrier layer 372, the first conductive layer 374, and the second conductive layer 376, the descriptions of the barrier layer 172, the first conductive layer 174, and the second conductive layer 176 may be similarly applied.

The interconnection line 380 may be connected to an upper surface of the contact plug 370, and may include a conductive material, or the like. The interconnection line 380 may have a linear shape extending in the X-direction or the Y-direction. A shape of an interconnection structure including the interconnection line 380 may be variously changed in example embodiments. For example, according to example embodiments, a plug extending in the Z-direction may be further disposed between the interconnection line 380 and the contact plug 370.

The insulating layer 390 may be disposed to surround a side surface of the contact plug 370 and a side surface of the interconnection line 380, and may include an insulating material, or the like.

Referring to the example embodiment shown in FIG. 10B, in a semiconductor device 300*a*, an internal structure of a contact plug 370*a* may be different from that of the example embodiment of FIG. 10A.

The contact plug 370*a* may further include a third conductive layer 378 on a second conductive layer 376, sequentially stacked from inner side and bottom surfaces of a contact hole. The third conductive layer 378 may include a material, different from those of a barrier layer 372, a first conductive layer 374, and a second conductive layer 376. According to an example embodiment, the third conductive layer 378 may not include tungsten (W). The third conductive layer 378 may include a material having excellent gap-fill properties, and may include, for example, polycrystalline silicon (Si), or the like.

FIGS. 11A, 11B, 11C, 11D, 11E, 11F, 11G, 11H, 11I, 11J, 11K, 11L, 11M and 11N are schematic cross-sectional views illustrating a method of manufacturing a semiconductor device according to example embodiments. FIGS. 11A, 11B, 11C, 11D, 11E, 11F, 11G, 11H, 11I, 11J, 11K, 11L, 11M and 11N illustrate a cross-section corresponding to the example embodiment shown in FIG. 2A, respectively.

Figure 11A:
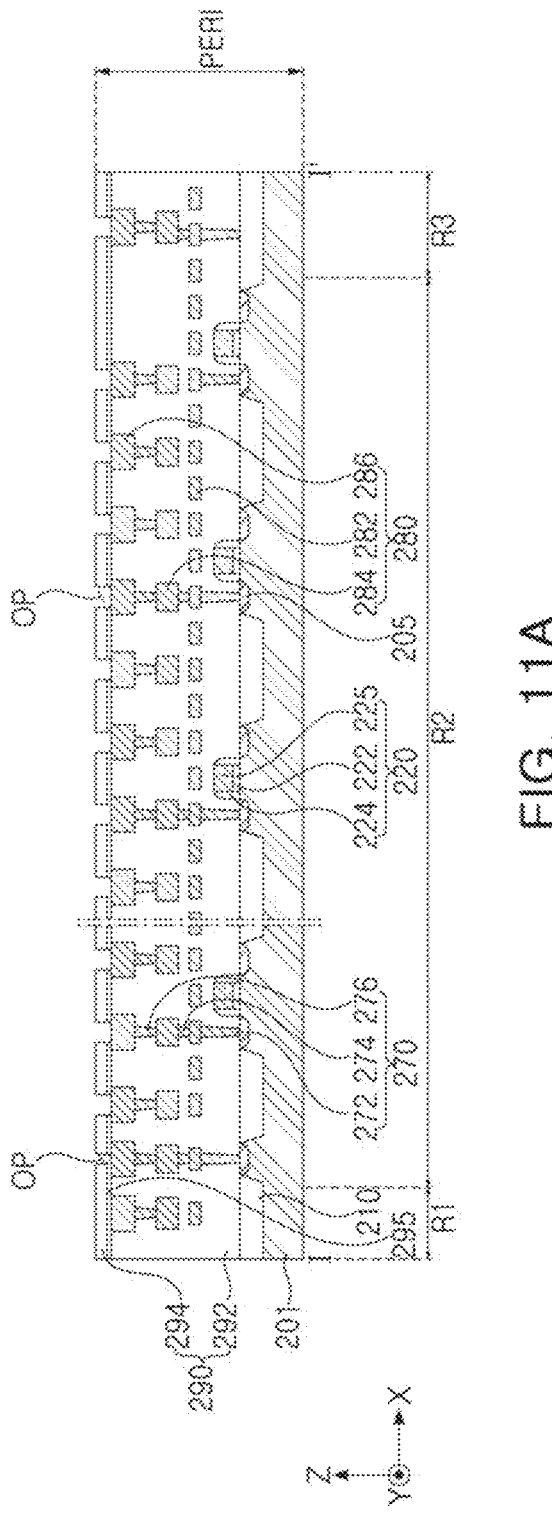
FIGS. 11A, 11B, 11C, 11D, 11E, 11F, 11G, 11H, 11I, 11J, 11K, 11L, 11M and 11N are schematic cross-sectional views illustrating a method of manufacturing a semiconductor device according to example embodiments.

Referring to the example embodiment shown in FIG. 11A, circuit devices 220, a lower interconnection structure, and a peripheral region insulating layer 290, constituting a peripheral circuit region PERI, may be formed on a substrate 201, and openings OP may be formed in a second peripheral region insulating layer 294.

First, device isolation layers 210 may be formed in the substrate 201, and a circuit gate dielectric layer 222 and a circuit gate electrode 225 may be sequentially formed on the substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, or the like, and the circuit gate electrode 225 may be formed of at least one of polycrystalline silicon or a metal silicide layer, or the like, but example embodiments are not limited thereto. Next, a spacer layer 224 and impurity regions 205 may be formed on both sidewalls of the circuit gate dielectric layer 222 and the circuit gate electrode 225. According to example embodiments, the spacer layer 224 may be formed as a plurality of layers. The impurity regions 205 may be formed by performing an ion implantation process.

Lower contact plugs 270 of the lower interconnection structure may be formed by partially forming a first peripheral region insulating layer 292, removing a portion thereof by etching, and then filling with conductive material. Lower interconnection lines 280 may be formed by, for example, depositing a conductive material and then patterning the same.

The first peripheral region insulating layer 292 may be formed as a plurality of insulating layers. The first peripheral region insulating layer 292 may be a portion in each operation of forming the lower interconnection structure. A lower protective layer 295 covering upper surfaces of third lower interconnection lines 286 may be formed on the first peripheral region insulating layer 292. A second peripheral region insulating layer 294 may be formed on the lower protective layer 295. Therefore, the peripheral circuit region PERI may be entirely formed.

Next, openings OP partially exposing the third lower interconnection lines 286 may be formed by partially removing the second peripheral region insulating layer 294 and the lower protective layer 295. The openings OP may be formed in a region in which the ground via 250, the fourth contact portions 170_4 of the contact plugs 170, and the fourth via portion 175_4 of the through-via 175 in FIGS. 2A, 2B, 2C, 3 and 4 are formed. According to example embodiments, when the openings OP are formed, the lower protective layer 295 may function as an etch stop layer.

The example embodiment of FIGS. 6A and 6B may be manufactured by forming the opening OP only in a region in which the ground via 250 is formed in this operation.

Figure 11B:
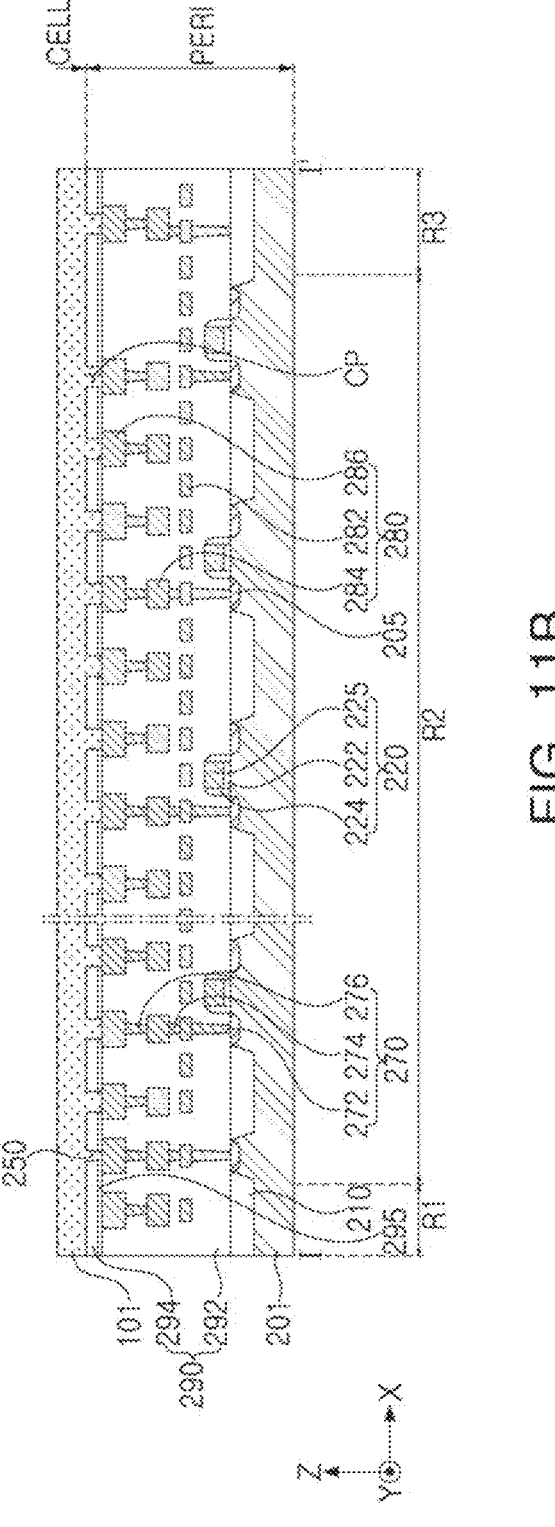

Referring to the example embodiment shown in FIG. 11B, a ground via 250 and a plate layer 101 may be formed.

The openings OP may be filled with a material forming a plate layer 101, and the plate layer 101 may be formed thereon. Therefore, a ground via 250 and pads CP may be formed in the openings OP. The pads CP may be layers with which the fourth contact portions 170_4 of the contact plugs 170 and the fourth via portion 175_4 of the through-via 175 in FIGS. 2A, 2B, 2C, 3 and 4 are replaced by a subsequent process. The plate layer 101, the ground via 250, and the pads CP may be formed of, for example, polycrystalline silicon, or the like, and may be formed by a CVD process.

Figure 11C:
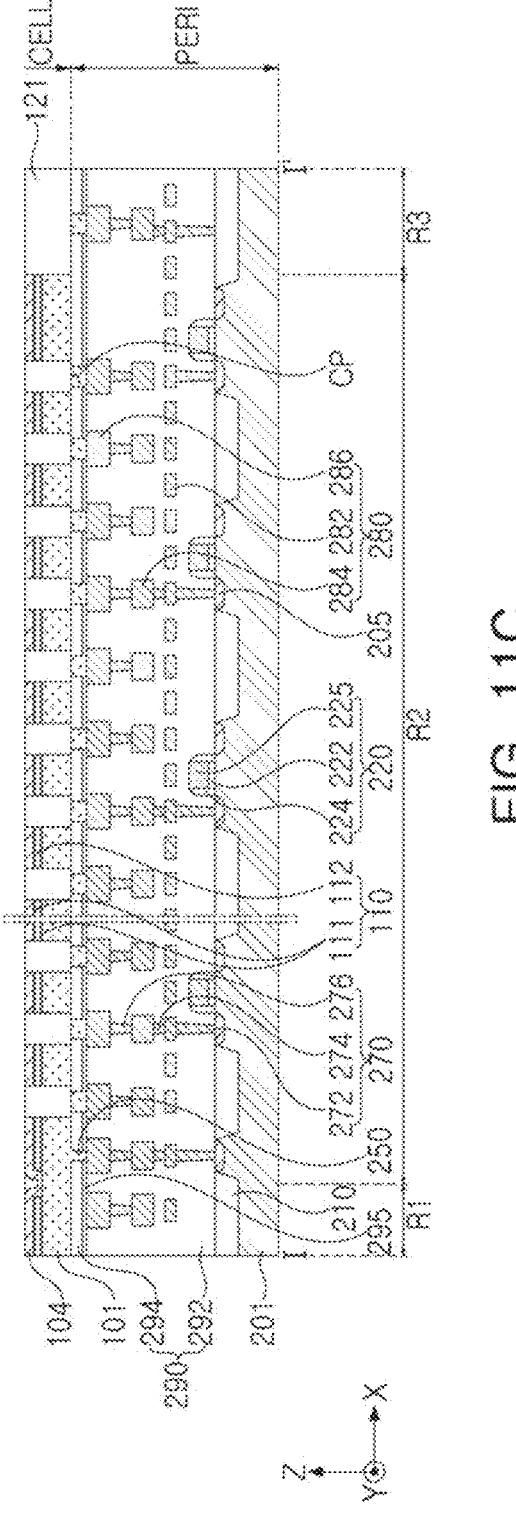

Referring to the example embodiment shown in FIG. 11C, a horizontal insulating layer 110 and a second horizontal conductive layer 104 may be formed on the plate layer 101, and substrate insulating layers 121 may be formed.

First and second horizontal insulating layers 111 and 112 constituting the horizontal insulating layer 110 may be alternately stacked on the plate layer 101. The horizontal insulating layer 110 may be a layer to be partially replaced with the first horizontal conductive layer 102 (refer to the example embodiment shown in FIG. 2A) by a subsequent process. The first horizontal insulating layers 111 may include a material, different from that of the second horizontal insulating layer 112. For example, the first horizontal insulating layers 111 may be formed of the same material as interlayer insulating layers 120, and the second horizontal insulating layer 112 may be formed of the same material as subsequent sacrificial insulating layers 118. A portion of the horizontal insulating layer 110 may be removed in some regions, for example, in a second region R2, by a patterning process.

The second horizontal conductive layer 104 may be formed on the horizontal insulating layer 110, and may be in contact with the plate layer 101 in a region from which the horizontal insulating layer 110 is removed. Therefore, the second horizontal conductive layer 104 may be bent along end portions of the horizontal insulating layer 110, may cover the end portions, and may extend onto the plate layer 101.

The substrate insulating layers 121 may be formed by partially removing the plate layer 101, the horizontal insulating layer 110, and the second horizontal conductive layer 104 in regions on the pads CP and in a third region R3, depositing an insulating material, and performing a planarization process such as chemical mechanical planarization (CMP). For example, the substrate insulating layers 121 may be formed on the pads CP to have a wider width than the pads CP.

Figure 11D:
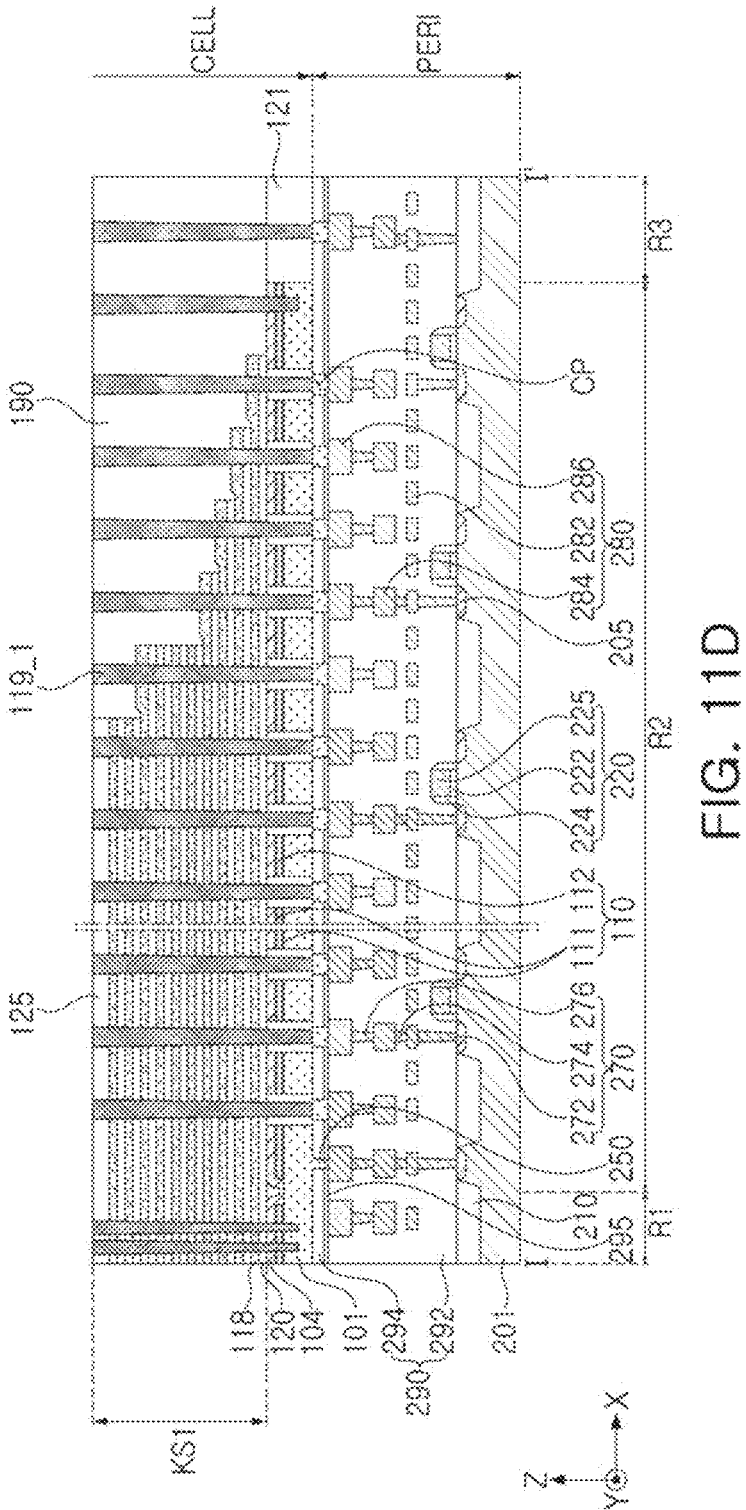

Referring to the example embodiment shown in FIG. 11D, a first mold structure KS1 may be formed by alternately stacking sacrificial insulating layers 118 and interlayer insulating layers 120 on the second horizontal conductive layer 104, and first vertical sacrificial portions 119_1 penetrating the first mold structure KS1 may be formed.

The first mold structure KS1 may be formed by alternately stacking the sacrificial insulating layers 118 and the interlayer insulating layers 120 on a height level corresponding to a first stack structure GS1 (refer to the example embodiment shown in FIG. 2A). The sacrificial insulating layers 118 may be layers to be at least partially replaced with gate electrodes 130 (refer to the example embodiment shown in FIG. 2A) by a subsequent process. The sacrificial insulating layers 118 may be formed of a material, different from that of the interlayer insulating layers 120, and may be formed of a material that may be etched with etching selectivity against the interlayer insulating layers 120 under specific etching conditions. For example, the interlayer insulating layer 120 may be formed of at least one of silicon oxide or silicon nitride, or the like, and the sacrificial insulating layers 118 may be formed of a material selected from silicon, silicon oxide, silicon carbide, or silicon nitride, different from the interlayer insulating layer 120. In example embodiments, thicknesses of the interlayer insulating layers 120 may not all be the same.

Next, photolithography and an etching processes of the sacrificial insulating layers 118 using a mask layer may be repeated such that upper sacrificial insulating layers 118 extend to be shorter than lower sacrificial insulating layers 118 in the second region R2. Therefore, the sacrificial insulating layers 118 may form a stepped structure having a stepped shape in a predetermined size. The sacrificial insulating layers 118 may be further formed on the stepped structure, such that the sacrificial insulating layers 118 located in an uppermost portion in each region have a relatively thick thickness.

Next, a cell region insulating layer 190 covering the first mold structure KS1 may be formed, and first vertical sacrificial portions 119_1 may be formed. The first vertical sacrificial portions 119_1 may be formed in a region corresponding to the first channel portions CH1, the first contact portions 170_1, the first via portion 175_1, and the first support portion DCH1 in the example embodiments shown in FIGS. 2A and 4. The first vertical sacrificial portions 119_1 may also be formed in a region corresponding to a lower region of the substrate contact 173. The first vertical sacrificial portions 119_1 may be formed by forming lower channel holes to penetrate the first mold structure KS1, depositing a material forming the vertical sacrificial structures 119 in the lower channel holes, and performing a planarization process.

The first vertical sacrificial portions 119_1 may be formed to have different depths. Height levels of upper surfaces of the first vertical sacrificial portions 119_1 may be substantially the same, but height levels of lower surfaces of the first vertical sacrificial portions 119_1 may be partially different from each other. The lower surfaces of the first vertical sacrificial portions 119_1 may be located in the plate layer 101, in a region corresponding to the first channel portions CH1, the first support portion DCH1, and a lower region of the substrate contact 173, and may be formed to penetrate the substrate insulating layers 121 to contact the pads CP, in a region corresponding to the first contact portions 170_1, the first via portion 175_1, and a lower region of the substrate contact 173.

The first vertical sacrificial portions 119_1 may include a material, different from that of the interlayer insulating layers 120 and the sacrificial insulating layers 118. For example, the first vertical sacrificial portions 119_1 may include a semiconductor material such as polycrystalline silicon, a silicon-based insulating material, or a carbon-based material, or the like.

Figure 11E:
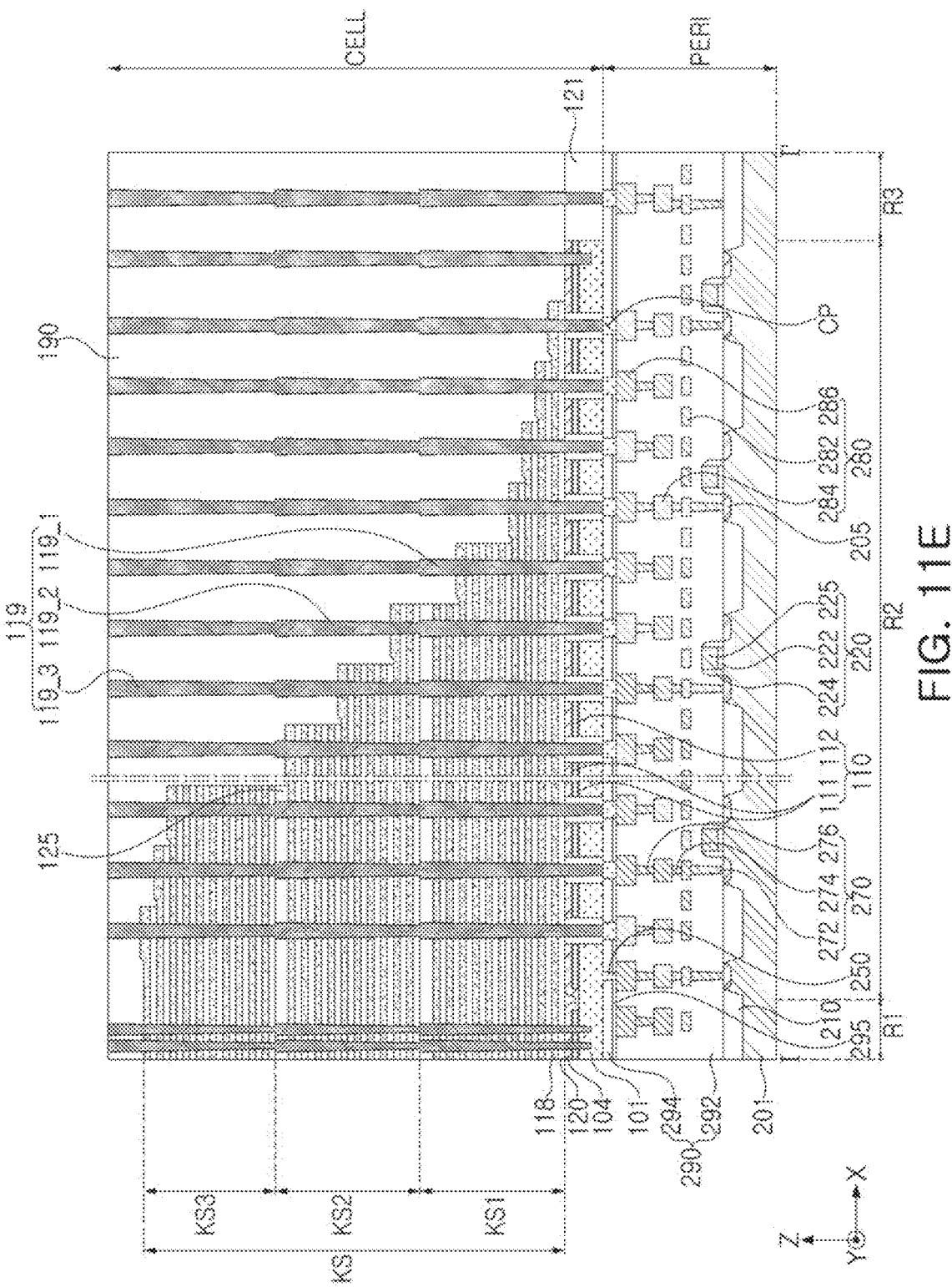

Referring to the example embodiment shown in FIG. 11E, second and third mold structures KS2 and KS3 may be formed by alternately stacking the sacrificial insulating layers 118 and the interlayer insulating layers 120, and second and third vertical sacrificial portions 119_2 and 119_3 penetrating the second and third mold structures KS2 and KS3 may be formed, respectively.

Similar to the first mold structure KS1 and the first vertical sacrificial portion 119_1, described above with reference to an example embodiment, after forming a second mold structure KS2 on the first mold structure KS1, a second vertical sacrificial portion 119_2 may be formed on the first vertical sacrificial portions 119_1. Next, after forming a third mold structure KS3 on the second mold structure KS2, a third vertical sacrificial portion 119_3 may be formed on the second vertical sacrificial portion 119_2. The second vertical sacrificial portions 119_2 may be formed on substantially the same height level as each other, and the third vertical sacrificial portions 119_3 may also be formed on substantially the same height level as each other.

The first, second and third vertical sacrificial portions 119_1, 119_2, and 119_3 may be connected to each other in the Z-direction to form vertical sacrificial structures 119. The vertical sacrificial structures 119 may be disposed to penetrate a sacrificial structure KS including the first, second and third mold structures KS1, KS2, and KS3.

Figure 11F:
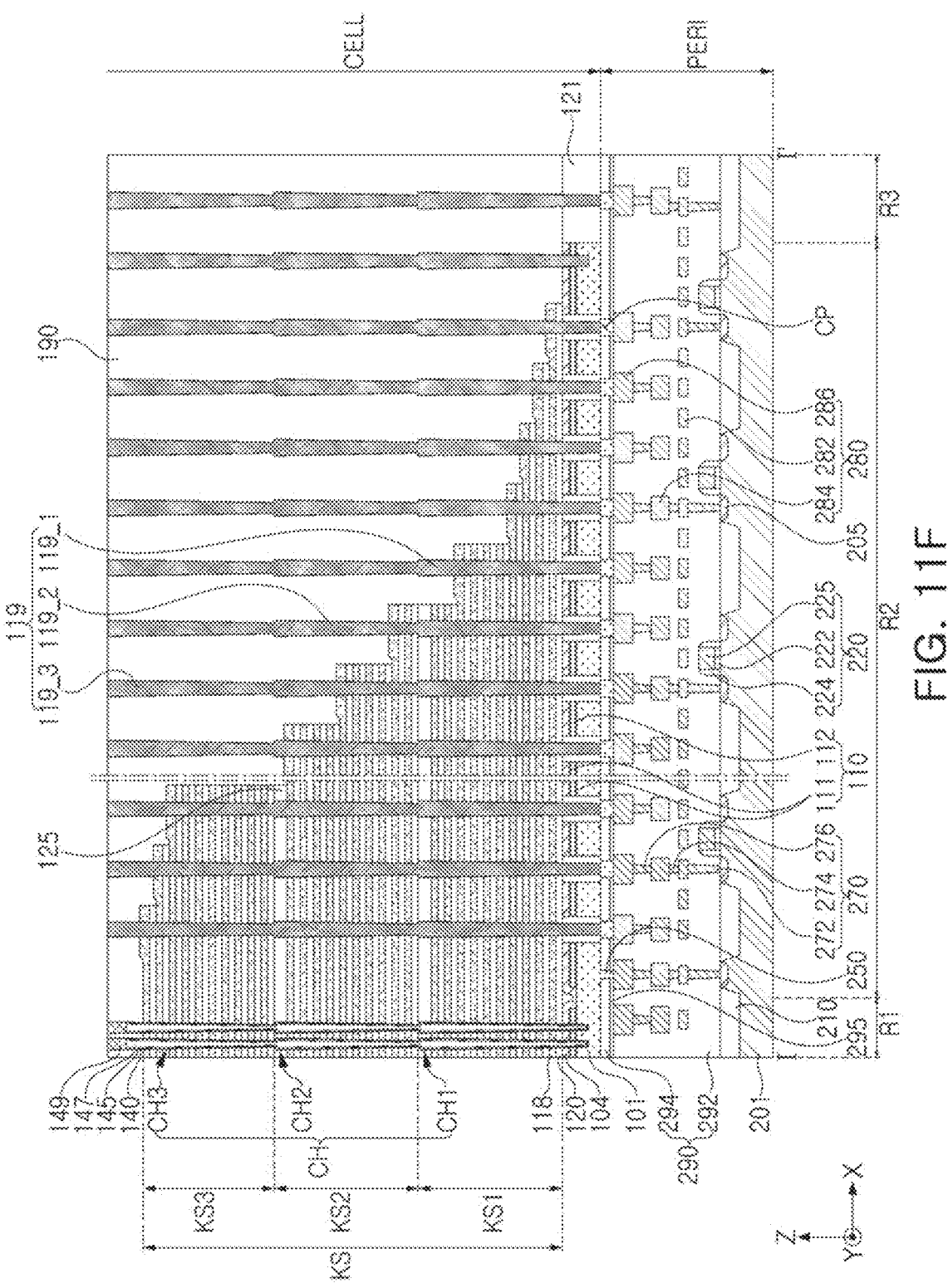

Referring to the example embodiment shown in FIG. 11F, the vertical sacrificial structures 119 may be partially removed to form channel structures CH.

First, upper separation regions US (refer to the example embodiment shown in FIG. 2B) may be formed. The upper separation regions US may be formed by removing a predetermined number of sacrificial insulating layers 118 and a predetermined number of interlayer insulating layers 120 from the top, and depositing an insulating material thereon to form an upper separation insulating layer 103 (refer to the example embodiment shown in FIG. 2B).

Next, after forming a mask layer to expose only vertical sacrificial structures 119 in regions in which channel structures CH are formed, among the vertical sacrificial structures 119, the exposed vertical sacrificial structures 119 may be removed to selectively form channel holes. Channel structures CH may be formed by sequentially forming at least a portion of a gate dielectric layer 145, a channel layer 140, a channel buried insulating layer 147, and a channel pad 149 in the channel holes.

The gate dielectric layer 145 may be formed to have a uniform thickness using an ALD or CVD process. In this operation, all or a portion of the gate dielectric layer 145 may be formed, and a portion extending perpendicularly to the plate layer 101 along the channel structures CH may be formed. The channel layer 140 may be formed on the gate dielectric layer 145 in the channel holes. The channel buried insulating layer 147 may be formed to fill the channel holes, and may be an insulating material. The channel pad 149 may be formed of a conductive material, and may be formed of, for example, polycrystalline silicon, or the like.

After forming the channel structures CH, support structures DCH (refer to the example embodiments shown in FIGS. 2C and 4) may be formed in a similar manner. For example, the support structures DCH may be formed by forming a mask layer to expose only a portion of the vertical sacrificial structures 119, selectively removing the exposed vertical sacrificial structures 119 to form support holes, and filling the support holes with an insulating material. In some example embodiments, the support structures DCH may be formed before formation of the channel structures CH.

The example embodiment of FIG. 8 may be manufactured by forming the channel structures CH and the support structures DCH together in this operation.

Figure 11G:
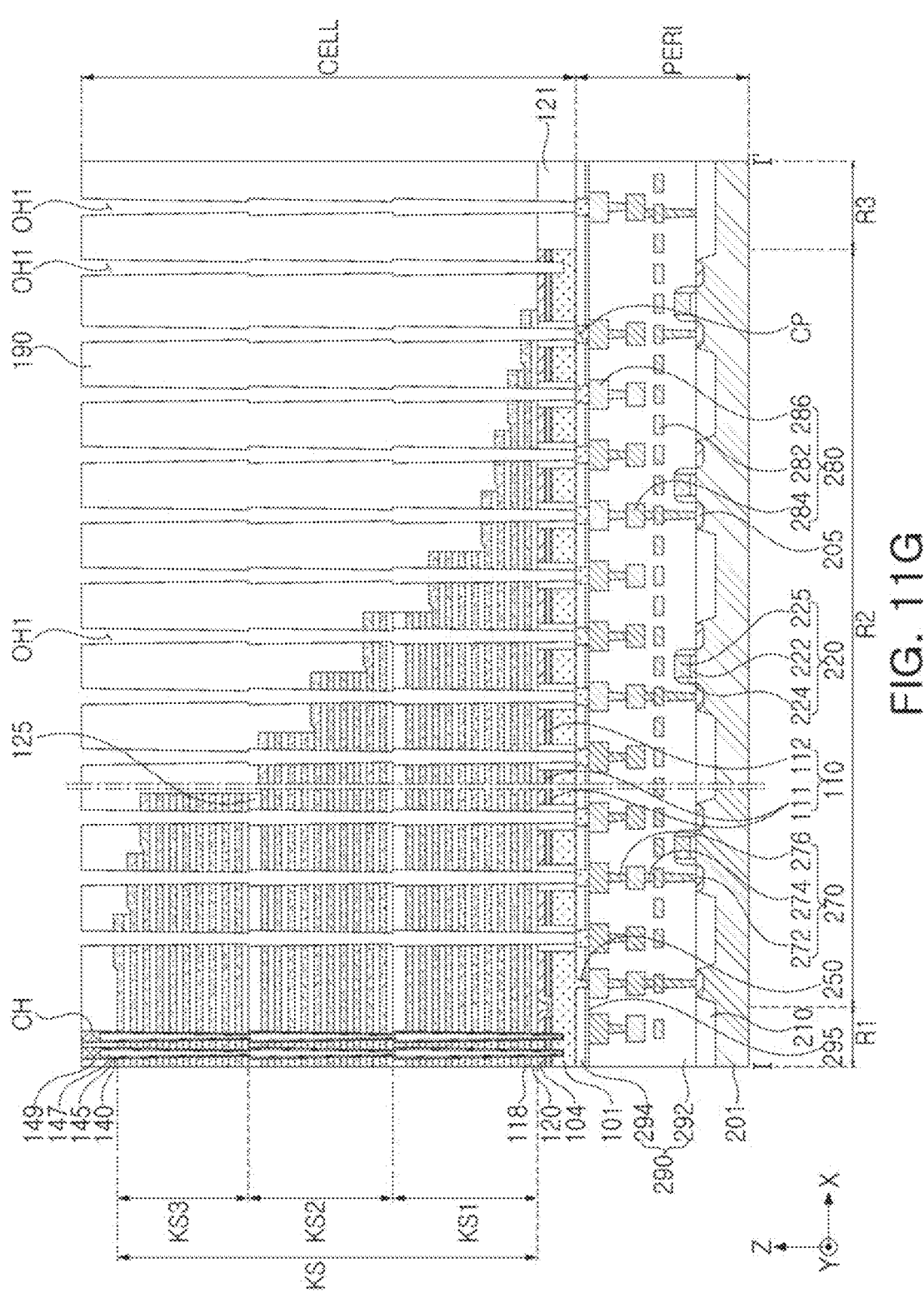

Referring to an example embodiment shown in FIG. 11G, a remaining portion of the vertical sacrificial structures 119 may be removed to form first contact holes OH1.

The first contact holes OH1 may be formed in regions corresponding to the contact plugs 170, the substrate contact 173, and the through-via 175 in the example embodiment shown in FIG. 2A. The first contact holes OH1 may be formed by selectively removing the vertical sacrificial structures 119, in regions corresponding to the contact plugs 170, the substrate contact 173, and the through-via 175. The pads CP may be exposed through bottom surfaces of the first contact holes OH1.

Figure 11H:
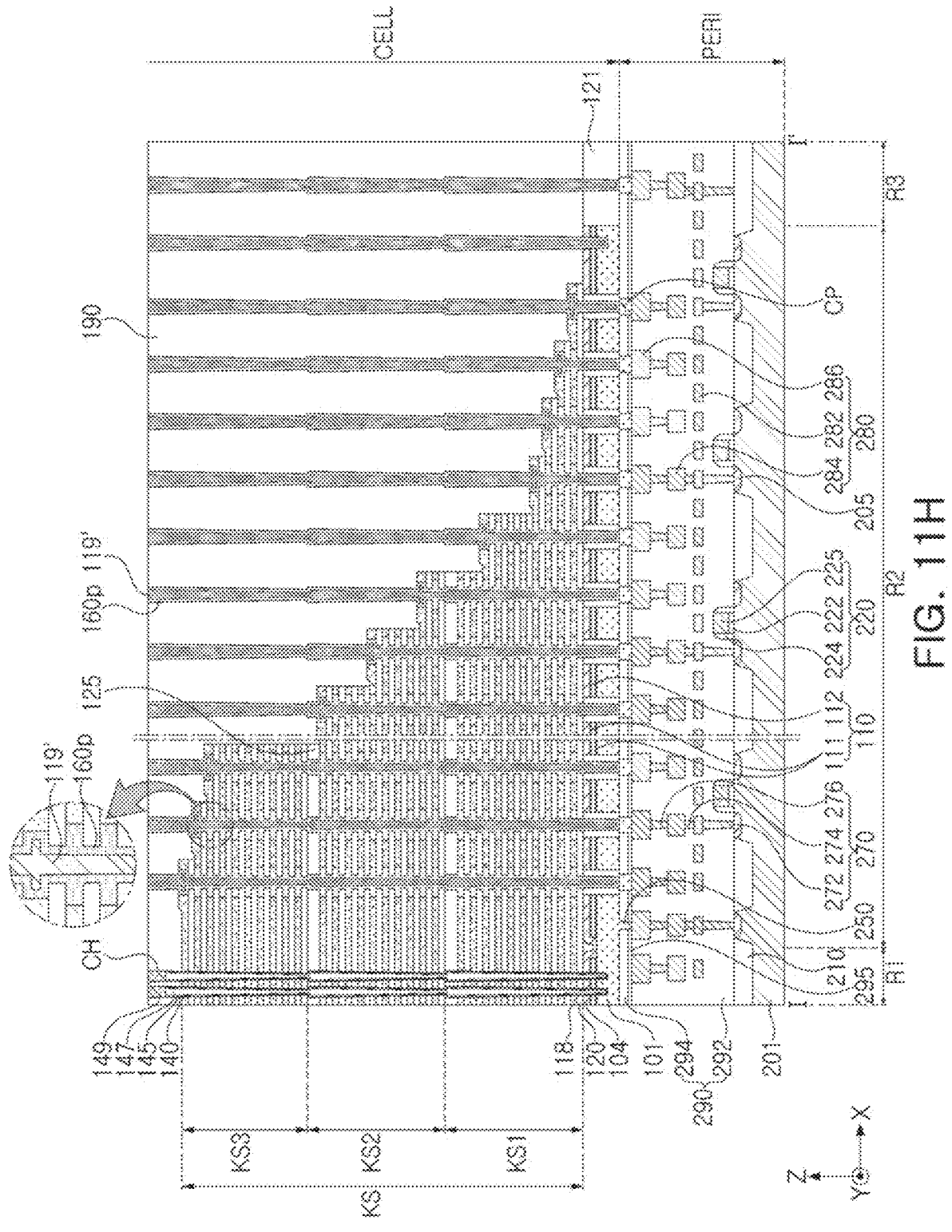

Referring to the example embodiment shown in FIG. 11H, preliminary contact insulating layers 160p may be formed in the first contact holes OH1, and vertical filling layers 119' may be formed.

First, the sacrificial insulating layers 118 exposed through the first contact holes OH1 may be partially removed. Tunnel portions may be formed by removing the sacrificial insulating layers 118 to a predetermined length around the first contact holes OH1. The tunnel portions may be formed to have a relatively short length in uppermost sacrificial insulating layers 118, and may be formed to have a relatively long length in sacrificial insulating layers 118 therebelow.

Specifically, according to an example embodiment, initially, the tunnel portions may be formed to have a relatively long length in the uppermost sacrificial insulating layers 118. This may be due to the fact that the uppermost sacrificial insulating layers 118 include a region having a relatively high etch rate than the sacrificial insulating layers 118 therebelow. Next, separate sacrificial layers may be formed in the first contact holes OH1 and the tunnel portions. The sacrificial layers may be formed of a material having a slower etching rate than the sacrificial insulating layers 118. Next, a portion of the sacrificial layer and a portion of the sacrificial insulating layers 118 may be removed. In this case, the sacrificial layer may remain in an uppermost portion, and a portion of the sacrificial insulating layers 118 after the sacrificial layer is removed may remain in a lower portion. As a result, the tunnel portions may be formed to have a relatively short length on the uppermost sacrificial insulating layers 118.

An insulating material may be deposited in the first contact holes OH1 and the tunnel portions to form preliminary contact insulating layers 160p. The preliminary contact insulating layers 160p may be formed on sidewalls of the first contact holes OH1, and may fill the tunnel portions. In the uppermost sacrificial insulating layers 118, the preliminary contact insulating layers 160p may not completely fill the tunnel portions.

The vertical filling layers 119' may fill the first contact holes OH1, and may fill uppermost tunnel portions. The vertical filling layers 119' may include a material, different from that of the preliminary contact insulating layers 160p, and may include, for example, polycrystalline silicon, or the like.

Figure 11I:
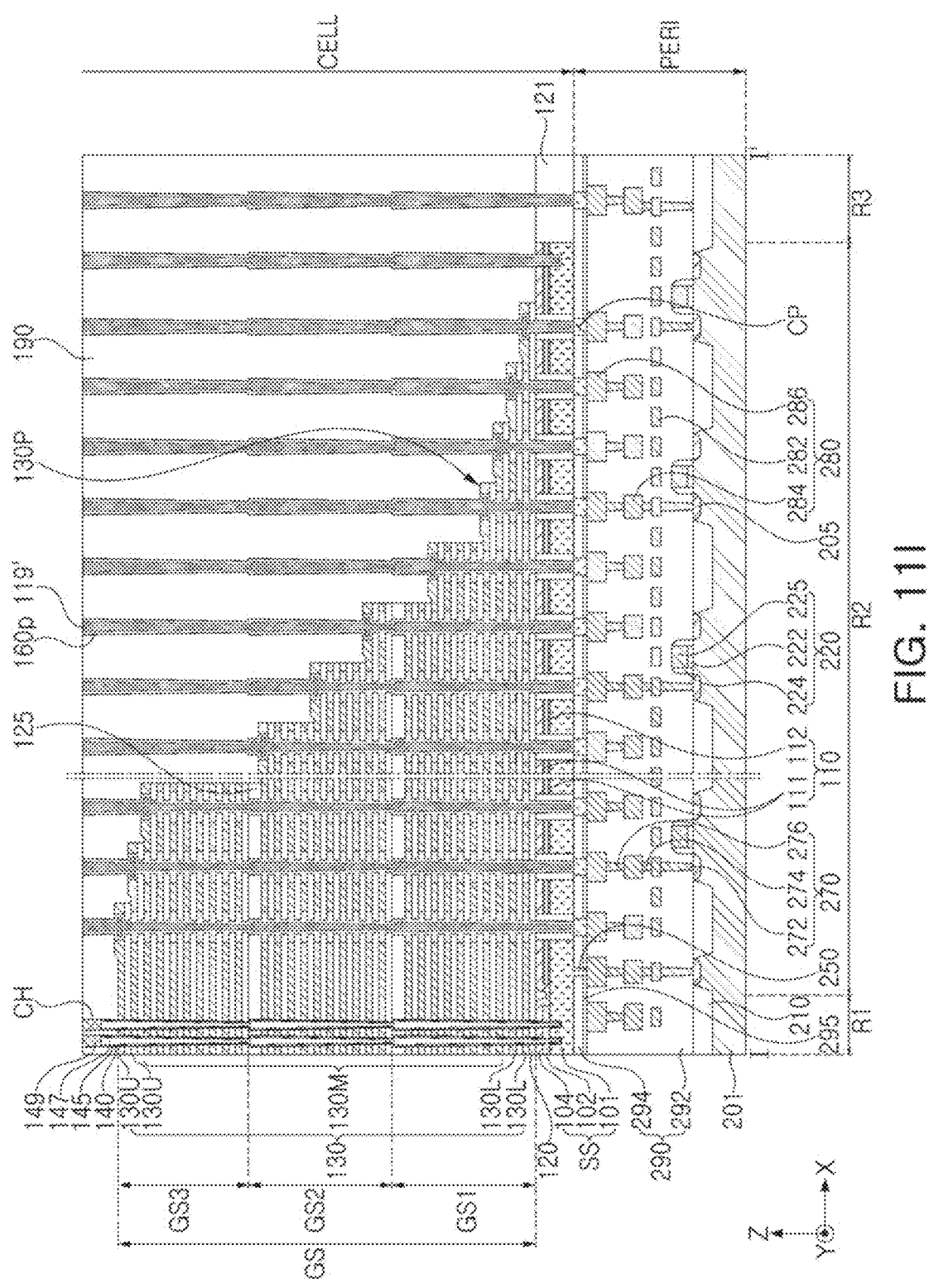

Referring to the example embodiment shown in FIG. 11I, after the first horizontal conductive layer 102 is formed and the sacrificial insulating layers 118 are removed, gate electrodes 130 may be formed.

First, openings penetrating the sacrificial insulating layers 118 and the interlayer insulating layers 120 to extend to the plate layer 101 may be formed in positions of the first separation regions MS1, and the second separation regions MS2a and MS2b (refer to the example embodiment shown in FIG. 1). Next, an etch-back process may be performed while forming separate sacrificial spacer layers in the openings, to selectively remove the horizontal insulating layer 110 in the first region R1 and to remove a portion of the exposed gate dielectric layer 145 together. After the first horizontal conductive layer 102 is formed by depositing a conductive material in a region in which the horizontal insulating layer 110 is removed, the sacrificial spacer layers may be removed in the openings. The first horizontal conductive layer 102 may be formed in the first region R1 in this operation.

Next, the sacrificial insulating layers 118 may be selectively removed with respect to the interlayer insulating layers 120, the second horizontal conductive layer 104, and the preliminary contact insulating layers 160p, using, for example, wet etching. The gate electrodes 130 may be formed by depositing a conductive material in regions in which the sacrificial insulating layers 118 are removed. The conductive material may include a metal, polycrystalline silicon, or a metal silicide material, or the like. According to example embodiments, a portion of the gate dielectric layer 145 may be formed first before forming the gate electrodes 130. Therefore, a gate structure GS including first, second and third stack structures GS1, GS2, and GS3 may be formed.

After forming the gate electrodes 130, separation insulating layers 105 may be formed in the openings formed in regions of the first separation regions MS1, and the second separation regions MS2a and MS2b.

Figure 11J:
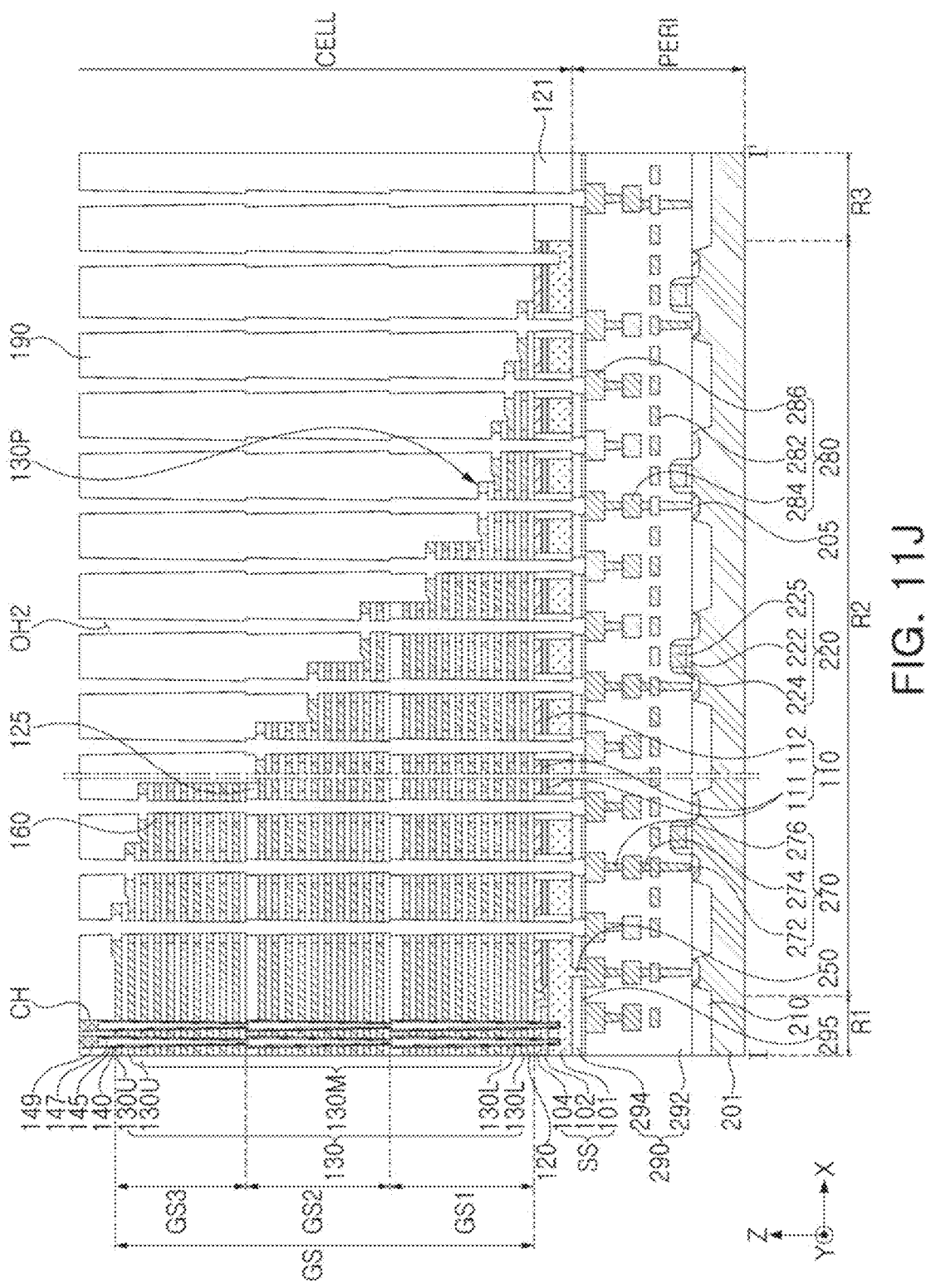

Referring to the example embodiment shown in FIG. 11J, second contact holes OH2 may be formed by removing the vertical filling layers 119' and removing the exposed pads CP.

The vertical filling layers 119' may be selectively removed with respect to the interlayer insulating layers 120 and the gate electrodes 130. After the vertical filling layers 119' are removed, the exposed preliminary contact insulating layers 160p may also be partially removed. In this case, all of the preliminary contact insulating layers 160p may be removed from pad regions 130P, and may remain therebelow to form contact insulating layers 160. In the pad regions 130P, when the gate dielectric layer 145 is exposed after the preliminary contact insulating layers 160p are removed, the gate dielectric layer 145 may also be removed to expose side surfaces of the gate electrodes 130.

The vertical filling layers 119' may be removed to expose the underlying pads CP therebelow. The pads CP may be selectively removed with respect to the plate layer 101, the substrate insulating layer 121, the peripheral region insulating layer 290, and the like. The pads CP may be removed by, for example, wet etching. Therefore, the second contact holes OH2 having a shape extending below the first contact holes OH1 may be formed.

Figure 11K:
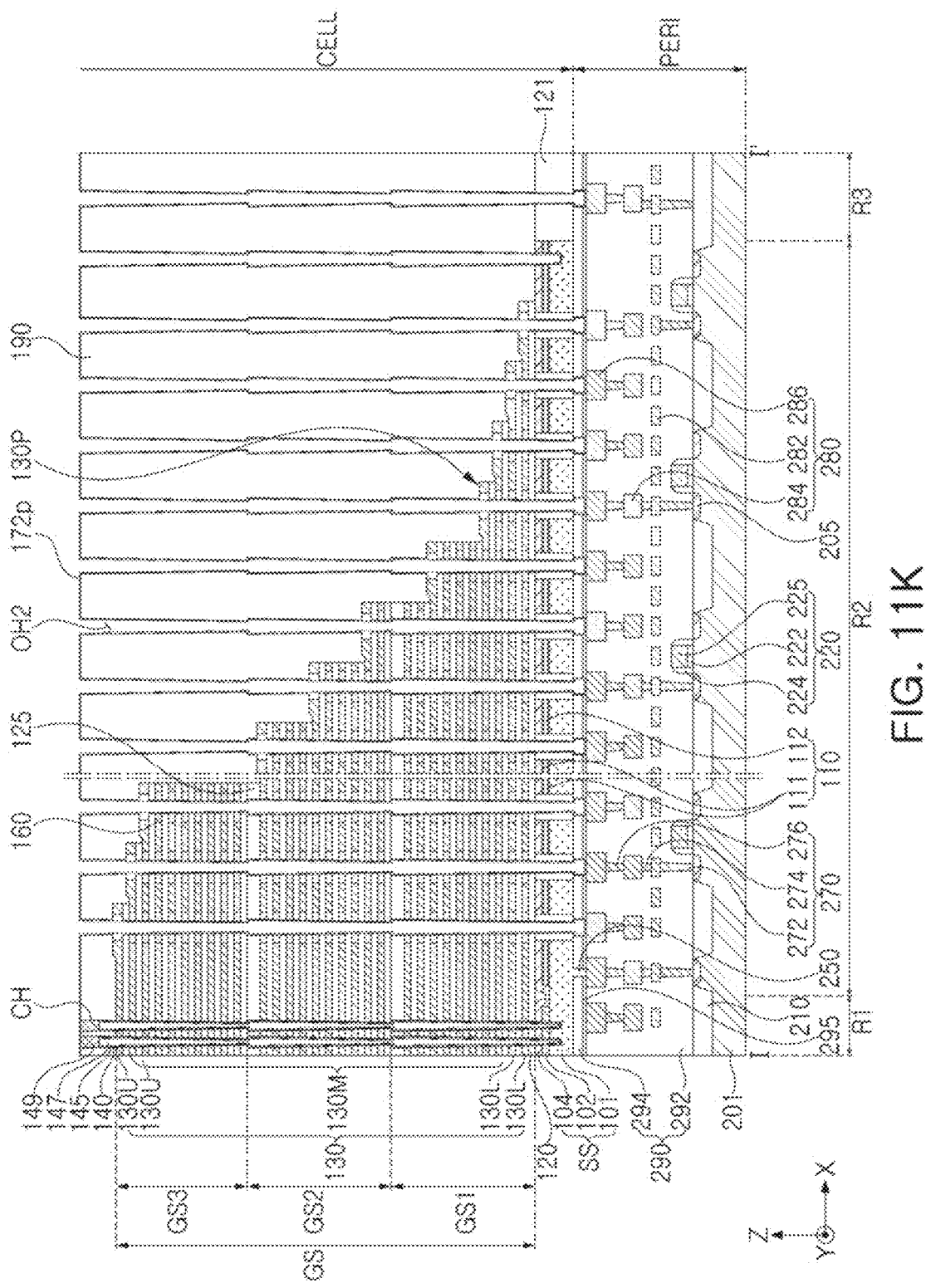

Referring to the example embodiment shown in FIG. 11K, a preliminary barrier layer 172*p* may be formed in the second contact holes OH2.

The preliminary barrier layer 172*p* may be formed to extend along inner side and bottom surfaces of the second contact holes OH2. For example, the preliminary barrier layer 172*p* may be formed to have a thickness of about 50 Å to about 170 Å

Figure 11L:
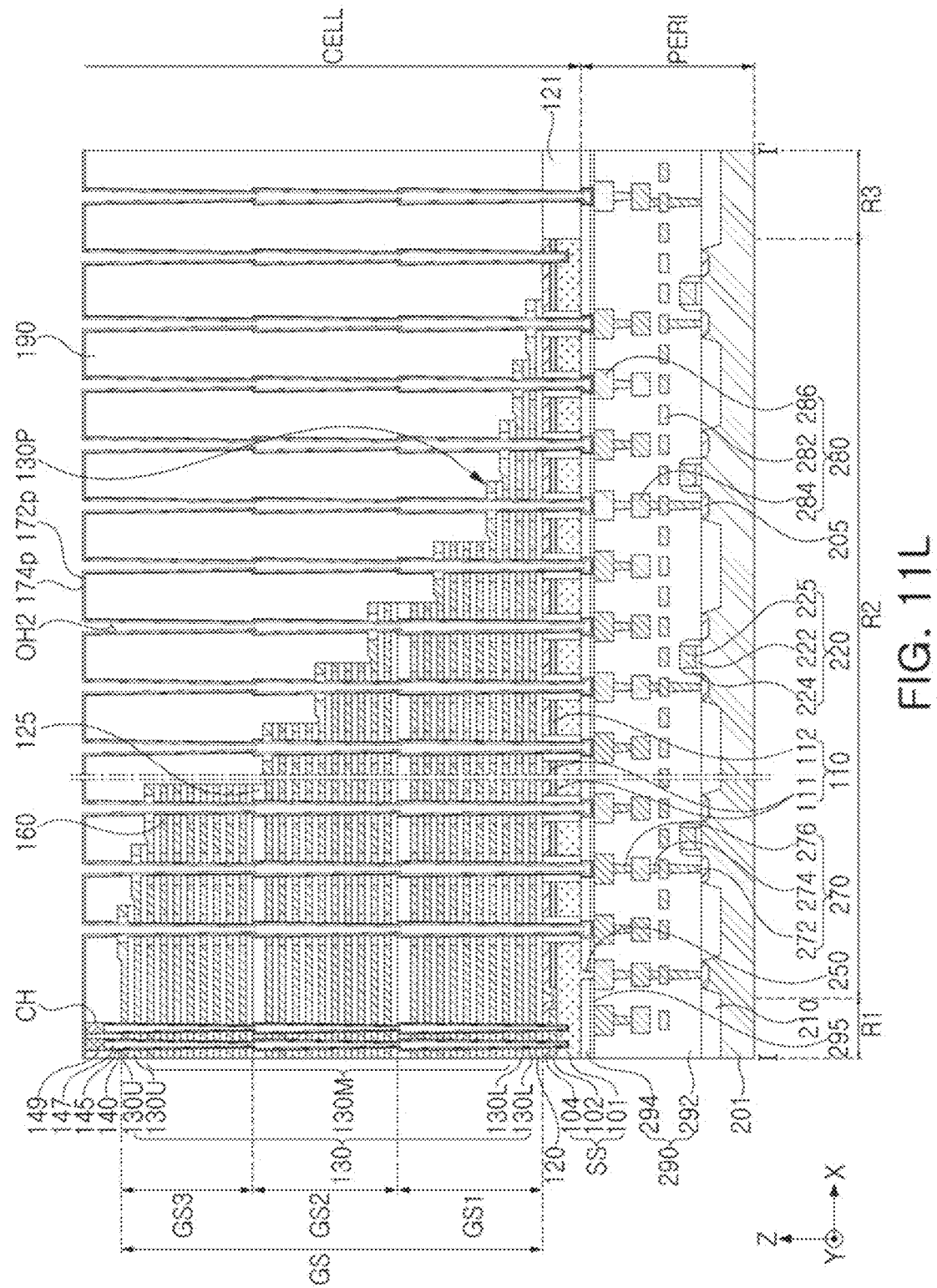

Referring to the example embodiment shown in FIG. 11L, a first preliminary conductive layer 174*p* may be formed in the second contact holes OH2.

The first preliminary conductive layer 174*p* may be formed on the preliminary barrier layer 172*p*. For example, the first preliminary conductive layer 174*p* may be formed to have a thickness of about 80 Å to about 220 Å.

A portion of a material from a source material of the first preliminary conductive layer 174*p* may remain in the second contact holes OH2. For example, when the first preliminary conductive layer 174*p* is formed of tungsten (W), a material including fluorine (F), for example, tungsten hexafluoride (WF$_6$) may be used as a tungsten (W) source material. In this case, a portion of fluorine (F) may remain in the second contact holes OH2.

Figure 11M:
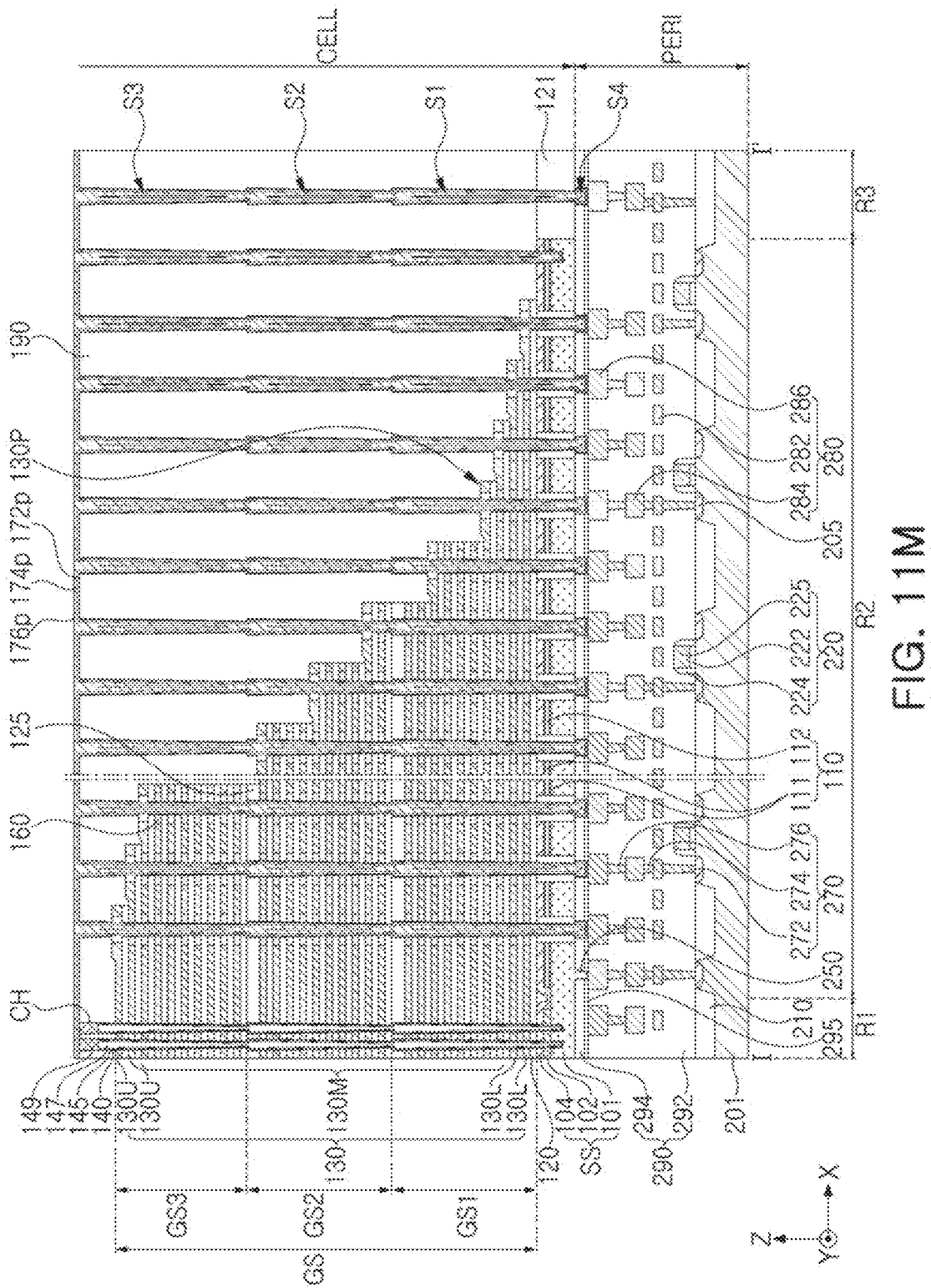

Referring to the example embodiment shown in FIG. 11M, a second preliminary conductive layer 176*p* may be formed in the second contact holes OH2.

The second preliminary conductive layers 176*p* may be respectively formed on the first preliminary conductive layers 174*p*. For example, the second preliminary conductive layer 176*p* may be formed to have a thickness of about 800 Å to about 1800 Å.

The second preliminary conductive layer 176*p* may include voids S1, S2, S3, and S4. The voids S1, S2, S3, and S4 may be formed to be spaced apart from each other in the Z-direction. In the voids S1, S2, S3, and S4, a portion of a material from the source material of the above-described first preliminary conductive layer 174*p* may remain. Even in this case, the second preliminary conductive layer 176*p* may function as a diffusion barrier for the material, to prevent the material from damaging the interlayer insulating layers 120 or the cell region insulating layer 190.

Figure 11N:
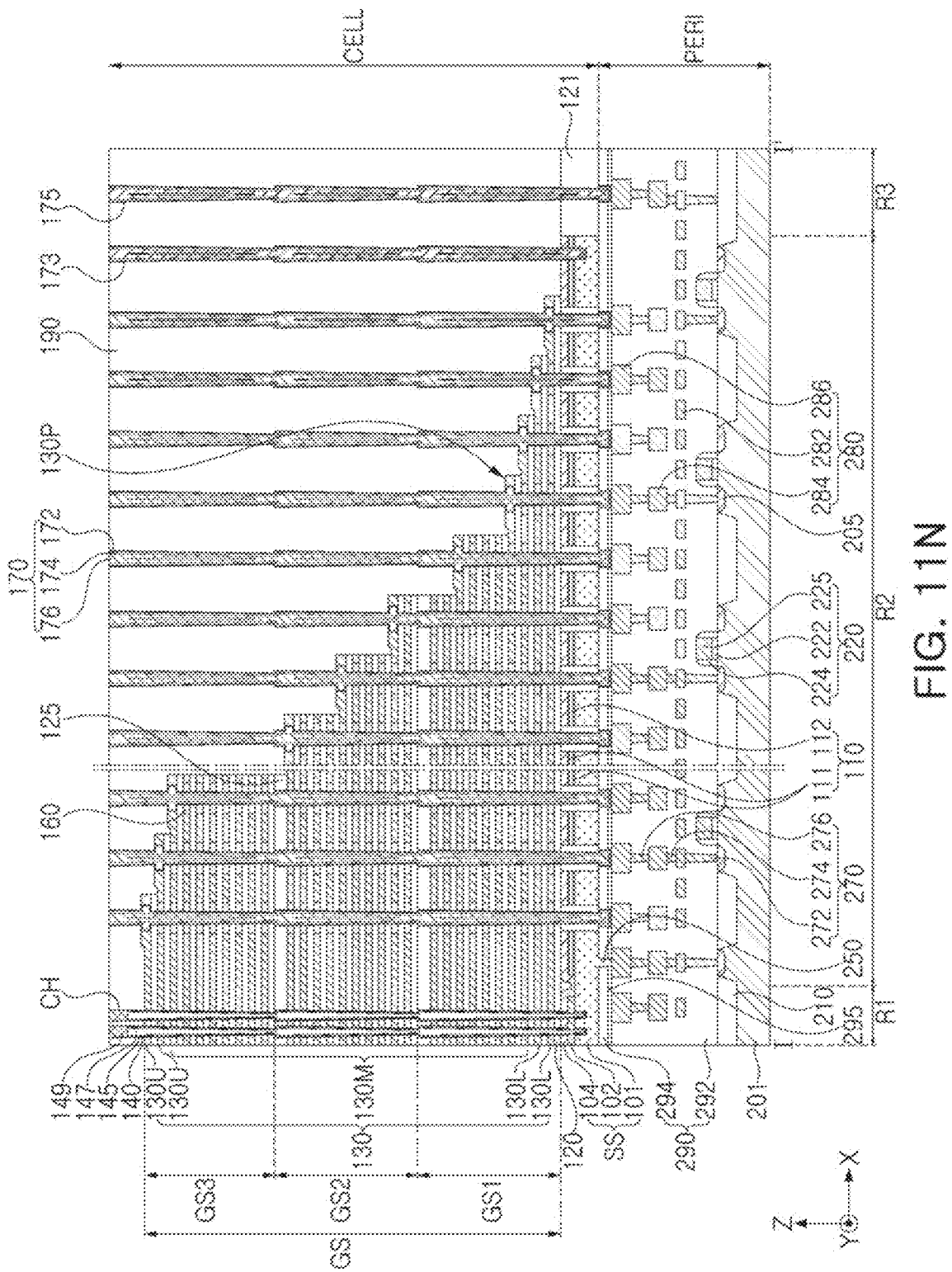

Referring to the example embodiment shown in FIG. 11N, the preliminary barrier layer 172*p*, the first preliminary conductive layer 174*p*, and the second preliminary conductive layer 176*p* may be removed from an upper surface of the cell region insulating layer 190, to form contact plugs 170, a substrate contact 173, and a through-via 175.

The preliminary barrier layer 172*p*, the first preliminary conductive layer 174*p*, and the second preliminary conductive layer 176*p* may form a barrier layer 172, a first conductive layer 174, and a second conductive layer 176, in the contact plugs 170, the substrate contact 173, and the through-via 175, respectively. The contact plugs 170, the substrate contact 173, and the through-via 175 may be formed together in the same process as described above, and may thus have the same internal structure.

Next, referring to the example embodiment shown in FIG. 2A, upper contact plugs 180 connected to upper ends of the channel structures CH, the contact plugs 170, the substrate contact 173, and the through-via 175 may be formed. Therefore, the semiconductor device 100 may be manufactured. In this operation, an upper contact plug 180 may not be formed on the supporter structures DCH (refer to the example embodiment shown in FIG. 2C).

Figure 12:
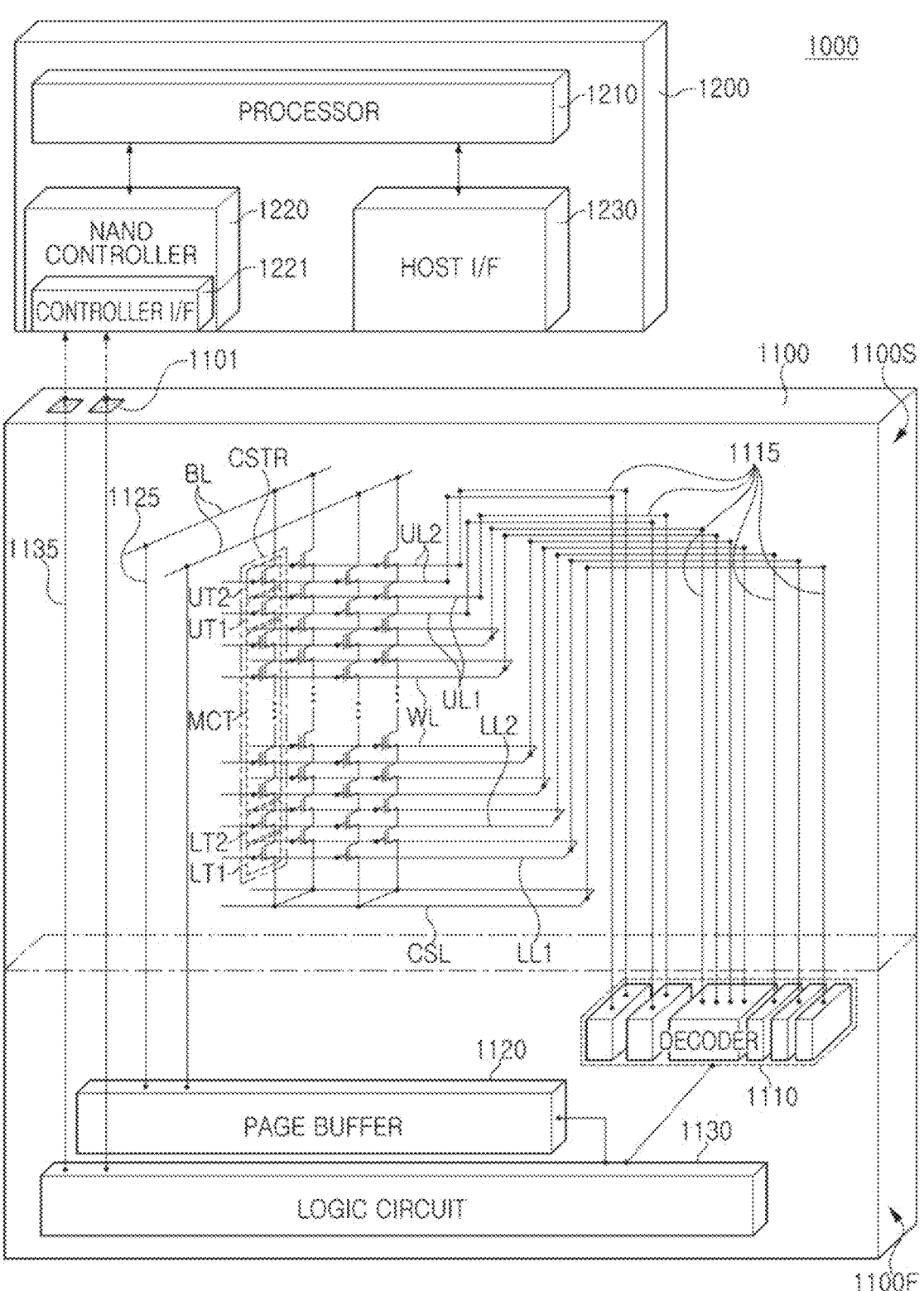
FIG. 12 is a view schematically illustrating a data storage system including a semiconductor device according to example embodiments.

FIG. 12 is a view schematically illustrating a data storage system including a semiconductor device according to example embodiments.

Referring to the example embodiment shown in FIG. 12, a data storage system 1000 may include a semiconductor device 1100, and a controller 1200 electrically connected to the semiconductor device 1100. The data storage system 1000 may be a storage device including the semiconductor device 1100 as a single semiconductor device or a plurality of semiconductor devices, or an electronic device including the storage device. For example, the data storage system 1000 may be a solid state drive device (SSD), a universal serial bus (USB), a computing system, a medical device, a communication device, including the semiconductor device 1100 as a single semiconductor device or a plurality of semiconductor devices, or the like.

The semiconductor device 1100 may be a non-volatile memory device, for example, a NAND flash memory device according to any one of the example embodiments described above with reference to FIGS. 1, 2, 3, 4, 5, 6, 7, 8 and 9. The semiconductor device 1100 may include a first structure 1100F, and a second structure 1100S on the first structure 1100F. In example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including bit lines BL, a common source line CSL, word lines WL, first and second upper gate lines UL1 and UL2, first and second lower gate lines LL1 and LL2, and memory cell strings CSTR between each of the bit lines BL and the common source line CSL.

In the second structure 1100S, each of the memory cell strings CSTR may include lower transistors LT1 and LT2 adjacent to the common source line CSL, upper transistors UT1 and UT2 adjacent to each of the bit lines BL, and a plurality of memory cell transistors MCT disposed between each of the lower transistors LT1 and LT2 and each of the upper transistors UT1 and UT2. The number of lower transistors LT1 and LT2 and the number of upper transistors UT1 and UT2 may be variously changed according to example embodiments.

In example embodiments, each of the upper transistors UT1 and UT2 may include a string select transistor, and each of the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In example embodiments, the lower transistors LT1 and LT2 may include a lower erase control transistor LT1 and a ground select transistor LT2, connected in series. The upper transistors UT1 and UT2 may include a string select transistor UT1 and an upper erase control transistor UT2, connected in series. At least one of the lower erase control transistor LT1 or the upper erase control transistor UT2 may be used for an erase operation of erasing data stored in the memory cell transistors MCT using a gate-induced-drain-leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection interconnections 1115 extending from the first structure 1100F into the second structure 1100S. The bit lines BL may be electrically connected to the page buffer 1120 through second connection interconnections 1125 extending from the first structure 1100F into the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through input/output connection interconnections 1135 extending from the first structure 1100F into the second structure 1100S.

The controller 1200 may include a processor 1210, a NAND controller 1220, and a host interface 1230. According to example embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to predetermined firmware, and may access to the semiconductor device 1100 by controlling the NAND controller 1220. The NAND controller 1220 may include a controller interface 1221 for processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, or the like may be transmitted through the controller interface 1221. The host interface 1230 may provide a communication function between the data storage system 1000 and an external host. When a control command is received from the external host through the host interface 1230, the processor 1210 may control the semiconductor device 1100 in response to the control command.

Figure 13:
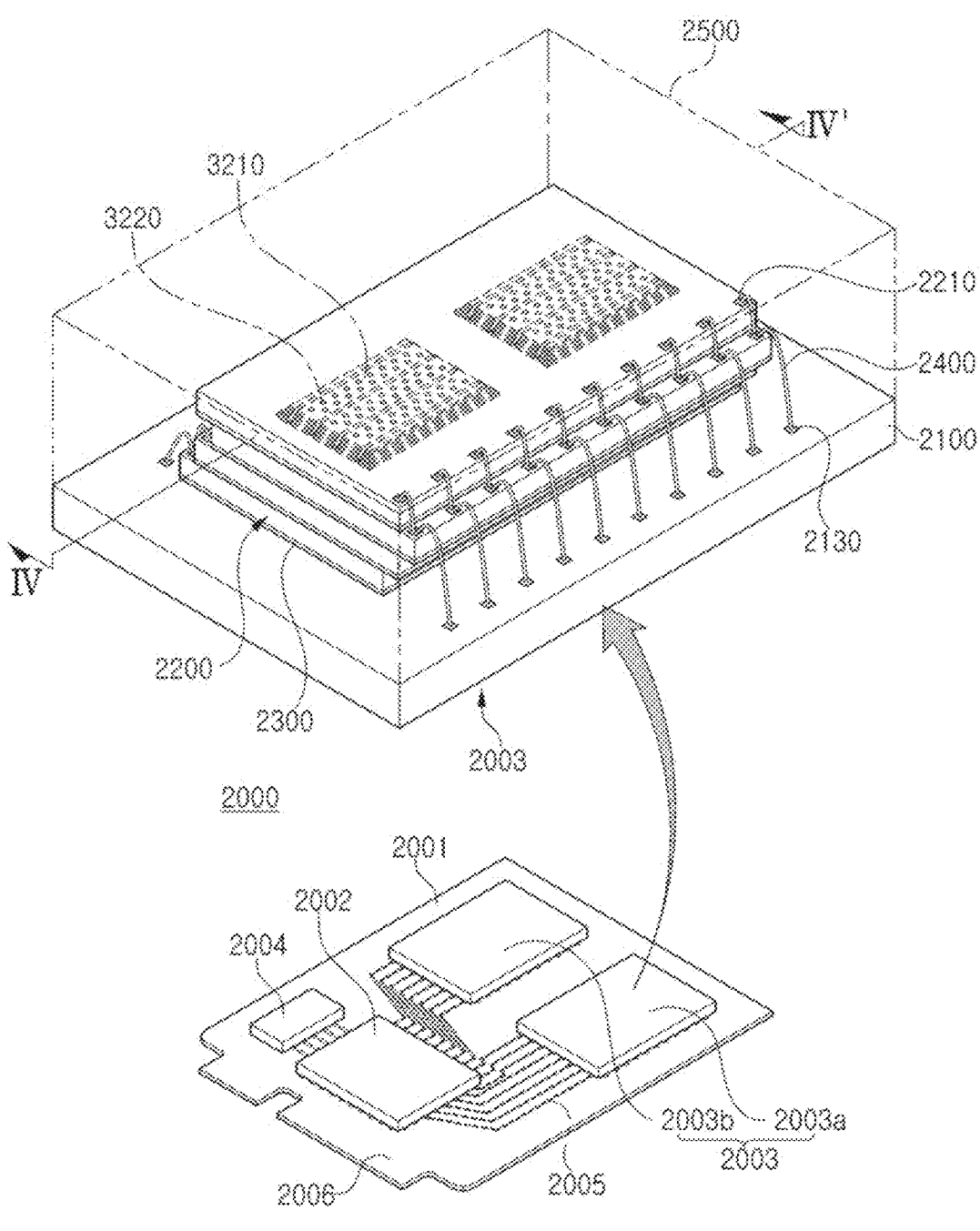
FIG. 13 is a perspective view schematically illustrating a data storage system including a semiconductor device according to an example embodiment.

FIG. 13 is a perspective view schematically illustrating a data storage system including a semiconductor device according to example embodiments.

Referring to the example embodiment shown in FIG. 13, a data storage system 2000 according to an example embodiment may include a main substrate 2001, a controller 2002 mounted on the main substrate 2001, at least one semiconductor package 2003, and a Dynamic Random Access Memory (DRAM) 2004. The semiconductor package 2003 and the DRAM 2004 may be connected to the controller 2002 by wiring patterns 2005 formed on the main substrate 2001.

The main substrate 2001 may include a connector 2006 including a plurality of pins, which may be coupled to an external host. The number and arrangement of the plurality of pins in the connector 2006 may vary according to a communication interface between the data storage system 2000 and the external host. In example embodiments, the data storage system 2000 may communicate with the external host according to any one interface of a universal serial bus (USB), peripheral component interconnect express (PCI-Express), serial advanced technology attachment (SATA), M-Phy for universal flash storage (UFS), or the like. In example embodiments, the data storage system 2000 may be operated by power supplied from the external host through the connector 2006. The data storage system 2000 may further include a power management integrated circuit (PMIC) distributing power, supplied from the external host, to the controller 2002 and the semiconductor package 2003.

The controller 2002 may write data to the semiconductor package 2003 or read data from the semiconductor package 2003, and may improve an operation speed of the data storage system 2000.

The DRAM 2004 may be a buffer memory reducing a difference in speed between the semiconductor package 2003, which may be a data storage space, and the external host. The DRAM 2004 included in the data storage system 2000 may also operate as a type of cache memory, and may provide a space temporarily storing data in a control operation on the semiconductor package 2003. When the DRAM 2004 is included in the data storage system 2000, the controller 2002 may further include a DRAM controller controlling the DRAM 2004, in addition to a NAND controller controlling the semiconductor package 2003.

The semiconductor package 2003 may include first and second semiconductor packages 2003a and 2003b, spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting each of the semiconductor chips 2200 and the package substrate 2100, and a molding layer 2500 covering the semiconductor chips 2200 and the connection structure 2400 on the package substrate 2100.

The package substrate 2100 may be a printed circuit board including package upper pads 2130. Each of the semiconductor chips 2200 may include an input/output pad 2210. Each of the semiconductor chips 2200 may include gate stack structures 3210 and channel structures 3220. Each of the semiconductor chips 2200 may include the semiconductor device described above with reference to example embodiments shown in FIGS. 1, 2, 3, 4, 5, 6, 7, 8 and 9.

In example embodiments, the connection structure 2400 may be a bonding wire electrically connecting the input/output pad 2210 and the upper package pads 2130. Therefore, in each of the first and second semiconductor packages 2003a and 2003b, the semiconductor chips 2200 may be electrically connected to each other by a bonding wire process, and may be electrically connected to the package upper pads 2130 of the package substrate 2100. According to example embodiments, in each of the first and second semiconductor packages 2003a and 2003b, the semiconductor chips 2200 may be electrically connected to each other by a connection structure including a through silicon via (TSV), instead of a connection structure 2400 by a bonding wire process.

In example embodiments, the controller 2002 and the semiconductor chips 2200 may be included in one (1) package. In an example embodiment, the controller 2002 and the semiconductor chips 2200 may be mounted on a separate interposer substrate, different from the main substrate 2001, and the controller 2002 and the semiconductor chips 2200 may be connected to each other by a wiring formed on the interposer substrate.

Figure 14:
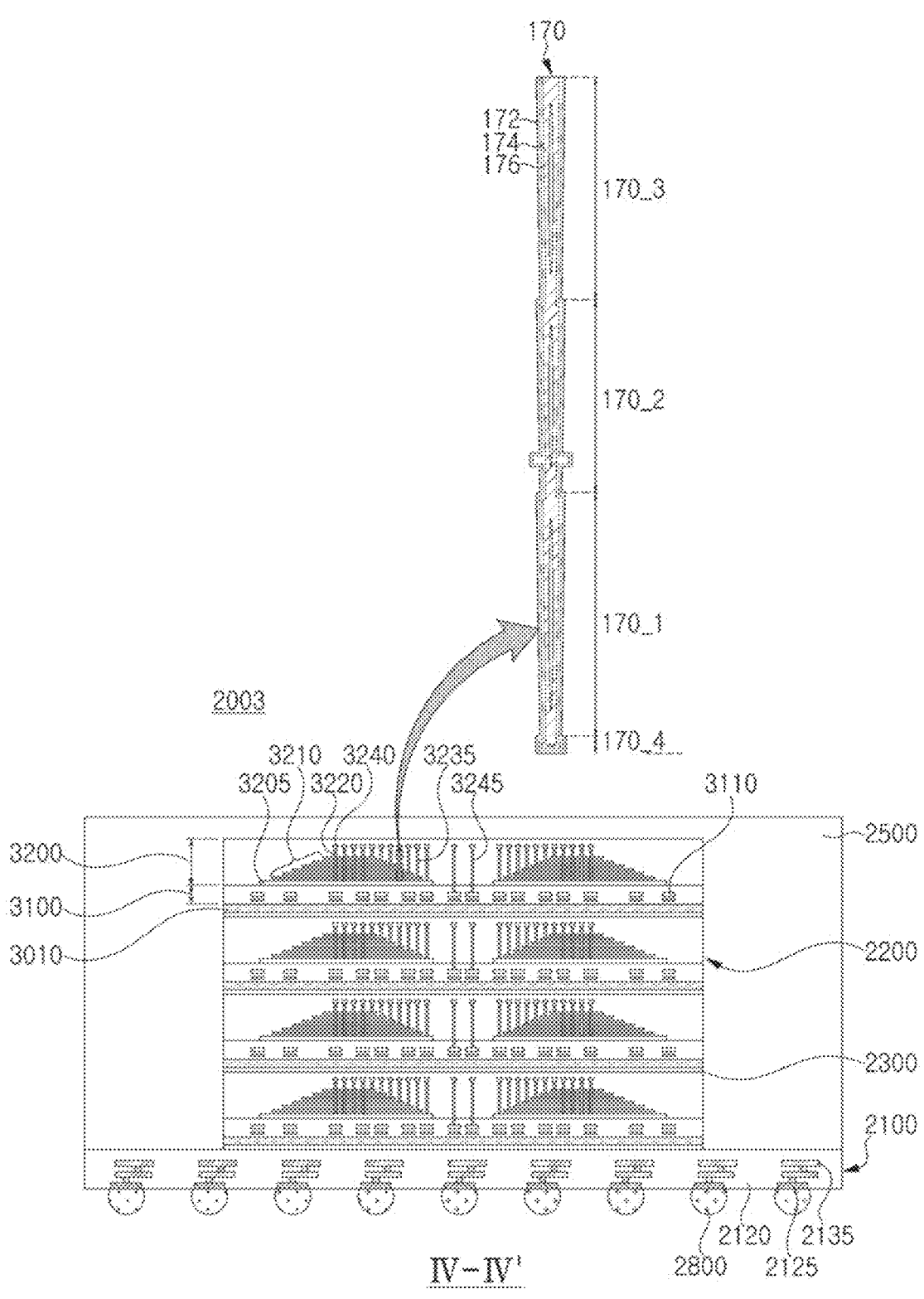
FIG. 14 is a cross-sectional view schematically illustrating a semiconductor package according to an example embodiment.

FIG. 14 is a cross-sectional view schematically illustrating a semiconductor package according to an example embodiment. FIG. 14 illustrates an example embodiment of the semiconductor package 2003 of FIG. 13, and conceptually illustrates a region taken along line IV-IV' of the semiconductor package 2003 of FIG. 13.

Referring to the example embodiment shown in FIG. 14, in a semiconductor package 2003, a package substrate 2100 may be a printed circuit board. The package substrate 2100 may include a package substrate body 2120, a package upper pads 2130 (refer to the example embodiment shown in FIG. 13) disposed on an upper surface of the package substrate body 2120, lower pads 2125 disposed on a lower surface of the package substrate body 2120 or exposed through the lower surface, and internal wirings 2135 electrically connecting the upper pads 2130 and the lower pads 2125 in the package substrate body 2120. The lower pads 2125 may be connected to wiring patterns 2005 of a main substrate 2001 of a data storage system 2000, as illustrated in FIG. 13, through conductive connection portions 2800.

Semiconductor chips 2200 may include a semiconductor substrate 3010, and a first structure 3100 and a second structure 3200, sequentially stacked on the semiconductor substrate 3010, respectively. The first structure 3100 may include a peripheral circuit region including peripheral interconnections 3110. The second structure 3200 may include a common source line 3205, a gate stack structure 3210 on the common source line 3205, channel structures 3220 penetrating the gate stack structure 3210, bit lines 3240 electrically connected to the channel structures 3220, and contact plugs 3235 electrically connected to word lines WL (refer to the example embodiment shown in FIG. 12) of the gate stack structure 3210. As described above with reference to FIGS. 1, 2, 3, 4, 5, 6, 7, 8 and 9, according to an example embodiment, each of the semiconductor chips 2200 may include a contact plug 170 including first, second, third and fourth contact portions 170_1, 170_2, 170_3, and 170_4. The contact plug 170 may have an internal structure in which a barrier layer 172, a first conductive layer 174, and a second conductive layer 176 are stacked.

Each of the semiconductor chips 2200 may include a through-interconnection 3245 electrically connected to the peripheral interconnections 3110 of the first structure 3100 and extending into the second structure 3200. The through-interconnection 3245 may be disposed outside the gate stack structure 3210, and may be further disposed to penetrate the gate stack structure 3210. Each of the semiconductor chips 2200 may further include an input/output pad 2210 (refer to the example embodiment shown in FIG. 13) electrically connected to the peripheral interconnections 3110 of the first structure 3100.

Structures of conductive layers in a contact plug may be optimized and the contact plug may have a bent portion on the same height level as a channel structure, to provide a semiconductor device having improved reliability and mass productivity.

Various advantages and effects of example embodiments are not limited to the above, and will be more easily understood by describing specific example embodiments.

While example embodiments have been illustrated and described above, it will be apparent to those skilled in the art that modifications and variations may be made without departing from the spirt and scope as defined by the following claims.

What is claimed is:
1. A semiconductor device comprising:
a first semiconductor structure comprising:
   a substrate;
   circuit devices on the substrate; and
   lower interconnection lines on the circuit devices; and a second semiconductor structure on the first semiconductor structure, and having a first region and a second region, the second semiconductor structure comprising:
a source structure;
gate electrodes spaced apart from each other and stacked on the source structure in a first direction perpendicular to an upper surface of the source structure;
channel structures penetrating through the gate electrodes in the first region, extending in the first direction, each of the channel structures comprising a channel layer;
contact plugs penetrating through the gate electrodes and the source structure in the second region, extending in the first direction, and electrically connecting the gate electrodes to a portion of the lower interconnection lines; and
support structures penetrating through the gate electrodes in the second region and extending in the first direction,
wherein each of the channel structures, each of the contact plugs, and each of the support structures comprises a first portion, a second portion, and a third portion, sequentially stacked from lower portions thereof, respectively,
wherein a width of an upper surface of the first portion is wider than a width of a lower surface of the second portion, respectively, and a width of an upper surface of the second portion is wider than a width of a lower surface of the third portion, respectively, and
wherein each of the contact plugs comprises:
a barrier layer;
a first conductive layer on the barrier layer; and
a second conductive layer on the first conductive layer, the second conductive layer having voids.
2. The semiconductor device of claim 1, wherein each of the contact plugs comprises:
a vertical extension portion extending in the first direction; and
a horizontal extension portion extending horizontally from the vertical extension portion toward a gate electrode connected to the horizontal extension portion, among the gate electrodes.
3. The semiconductor device of claim 2, wherein the horizontal extension portion comprises the barrier layer and the first conductive layer.
4. The semiconductor device of claim 1, wherein the barrier layer has a first thickness,
wherein the first conductive layer has a second thickness that is equal to or greater than the first thickness, and
wherein the second conductive layer has a third thickness that is equal to or greater than the second thickness.
5. The semiconductor device of claim 1, wherein the first conductive layer comprises tungsten (W), and
wherein the second conductive layer is free from tungsten (W).
6. The semiconductor device of claim 1, wherein the second conductive layer comprises at least one of titanium nitride (TiN) and tantalum nitride (TaN).
7. The semiconductor device of claim 1, wherein each of the contact plugs further comprises a fourth portion below the first portion, and
wherein a width of an upper surface of the fourth portion is wider than a width of a lower surface of the first portion.
8. The semiconductor device of claim 7, wherein the first semiconductor structure further comprises a ground via extending from a lower surface of the source structure in the first direction and connected to one of the lower interconnection lines, and wherein the fourth portion of each of the contact plugs overlaps the ground via in a second direction, perpendicular to the first direction.

9. The semiconductor device of claim 1, wherein each of the contact plugs further comprises a third conductive layer on the second conductive layer, and wherein the third conductive layer comprises a semiconductor material.

10. The semiconductor device of claim 1, wherein the second portions of the channel structures, the contact plugs, and the support structures are located on substantially a same height level, and wherein the third portions of the channel structures, the contact plugs, and the support structures are located on substantially a same height level.

11. The semiconductor device of claim 1, wherein the second semiconductor structure further comprises a through-via extending from an outside of the source structure in the first direction, wherein the through-via is connected to one of the lower interconnection lines, and wherein the through-via is substantially a same height level as the contact plugs, and has substantially a same shape as the contact plugs.

12. The semiconductor device of claim 1, wherein the source structure comprises:

a plate layer;

a first horizontal conductive layer on the plate layer in the first region; and a second horizontal conductive layer on the first horizontal conductive layer and extending into the second region.

13. A semiconductor device comprising:

a semiconductor structure comprising:

a substrate; and a conductive layer in or on the substrate; and a contact plug connected to the conductive layer and extending in a first direction that is perpendicular to an upper surface of the substrate, the contact plug comprising a first portion and a second portion that are sequentially stacked from a lower portion of the contact plug, wherein a width of an upper surface of the first portion is wider than a width of a lower surface of the second portion, and wherein the contact plug comprises:

a barrier layer;

a first conductive layer on the barrier layer; and a second conductive layer on the first conductive layer and comprising voids, wherein the barrier layer, the first conductive layer, and the second conductive layer, extend continuously in the first portion and the second portion, and wherein the barrier layer has a first thickness, wherein the second conductive layer has a second thickness that is equal to or greater than the first thickness, and wherein the first conductive layer has a third thickness that is equal to or greater than the second thickness.

14. The semiconductor device of claim 13, wherein the first conductive layer comprises tungsten (W), and wherein the barrier layer and the second conductive layer comprise at least one of titanium nitride (TiN) and tantalum nitride (TaN).

15. The semiconductor device of claim 13, wherein the voids comprise fluorine (F).

16. A data storage system comprising:

a semiconductor storage device comprising:

a substrate;

circuit devices on the substrate;

lower interconnection lines on the circuit devices;

a plate layer on the lower interconnection lines;

gate electrodes spaced apart from each other and stacked on the plate layer in a first direction, perpendicular to an upper surface of the plate layer;

a contact plug penetrating through the gate electrodes, extending in the first direction, and electrically connecting a first gate electrode, among the gate electrodes, to a first lower interconnection line, among the lower interconnection lines; and an input/output pad electrically connected to the circuit devices; and a controller electrically connected to the semiconductor storage device through the input/output pad and configured to control the semiconductor storage device, wherein the contact plug comprises:

a barrier layer;

a first conductive layer on the barrier layer;

a second conductive layer on the first conductive layer;

a vertical extension portion extending in the first direction; and a horizontal extension portion extending horizontally from the vertical extension portion toward the first gate electrode, and wherein the barrier layer comprises at least one of titanium nitride (TiN) and tantalum nitride (TaN).

17. The data storage system of claim 16, wherein the horizontal extension portion comprises the barrier layer and the first conductive layer.

18. The data storage system of claim 16, wherein the contact plug comprises a first portion and a second portion that are sequentially stacked from a lower portion of the contact plug, and wherein a width of an upper surface of the first portion is wider than a width of a lower surface of the second portion.

19. The data storage system of claim 18, wherein the semiconductor storage device further comprises a channel structure penetrating through the gate electrodes and extending in the first direction, the channel structure comprising a channel layer, wherein the channel structure comprises:

a first channel portion; and a second channel portion, wherein the first channel portion and the second channel portion are sequentially stacked from a lower portion of the channel structure, and wherein a width of an upper surface of the first channel portion is wider than a width of a lower surface of the second channel portion.

20. The data storage system of claim 16, wherein the semiconductor storage device further comprises a separation region penetrating through the gate electrodes, extending in the first direction, and comprising an insulating material, and wherein a side surface of the separation region has a substantially constant inclination without a bending portion.

* * * * *